(12) United States Patent
Yoshikawa et al.

(10) Patent No.: US 7,344,806 B2
(45) Date of Patent: Mar. 18, 2008

(54) METHOD OF PRODUCING PHASE SHIFT MASK BLANK, METHOD OF PRODUCING PHASE SHIFT MASK, PHASE SHIFT MASK BLANK, AND PHASE SHIFT MASK

(75) Inventors: Hiroki Yoshikawa, Niigata (JP); Yukio Inazuki, Niigata (JP); Noriyasu Fukushima, Niigata (JP); Hideo Kaneko, Niigata (JP); Satoshi Okazaki, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 445 days.

(21) Appl. No.: 10/806,202

(22) Filed: Mar. 23, 2004

(65) Prior Publication Data

US 2004/0191646 A1    Sep. 30, 2004

(30) Foreign Application Priority Data

Mar. 31, 2003   (JP)   ............................. 2003-093280
Mar. 31, 2003   (JP)   ............................. 2003-093296
Mar. 31, 2003   (JP)   ............................. 2003-093301

(51) Int. Cl.
  *G03F 1/00*  (2006.01)
(52) U.S. Cl. ........................................ 430/5
(58) Field of Classification Search ................ 430/5;
  403/322; 204/298.04, 192.11, 192.15, 298.08
  See application file for complete search history.

(56) References Cited

U.S. PATENT DOCUMENTS

| 6,153,341 | A  | * | 11/2000 | Mitsui et al. ................... 430/5 |
| 6,569,577 | B1 | * | 5/2003  | Isao et al. ...................... 430/5 |
| 6,635,155 | B2 | * | 10/2003 | Miyamura et al. ..... 204/192.13 |
| 6,858,357 | B2 | * | 2/2005  | Angelopoulos et al. ........ 430/5 |

FOREIGN PATENT DOCUMENTS

| JP | A 7-140635  | 6/1995 |
| JP | A-08-137094 | 5/1996 |
| JP | A-11-282150 | 10/1999 |
| JP | A-2002-072443 | 3/2002 |
| JP | A-2003-005347 | 1/2003 |

* cited by examiner

*Primary Examiner*—S. Rosasco
(74) *Attorney, Agent, or Firm*—Oliff & Berridge, PLC

(57) ABSTRACT

There is disclosed a method of producing a phase shift mask blank wherein the method includes at least a step of forming one or more layers of phase shift films on a substrate by a sputtering method, and in the step, the phase shift films are formed by the sputtering method while simultaneously discharging plural targets having different compositions. Thereby, a phase shift mask blank having a desired composition and quality, in particular, having a phase shift film with few defects can be easily produced.

31 Claims, 15 Drawing Sheets (a)

(b)

(c)

(A)

(B)

(C)

(D)

(a)

(b)

(c)

(a)

(b)

(c)

(d)

METHOD OF PRODUCING PHASE SHIFT MASK BLANK, METHOD OF PRODUCING PHASE SHIFT MASK, PHASE SHIFT MASK BLANK, AND PHASE SHIFT MASK

BACKGROUND OF THE INVENTION

1. Field of the Invention

The present invention relates to a phase shift mask blank and phase shift mask used for fabricating a semiconductor integrated circuit, and each production method, and in particular, relates to a halftone phase shift mask blank and a halftone phase shift mask wherein an intensity of an exposure wavelength light is attenuated by a phase shift film, and each production method.

2. Related Art

As miniaturization technique of semiconductor devices has been progressed, stabilization of a device fabrication process and measures for finer particles have come to attract attention as important matters. In the ITRS (International Technology Roadmap for Semiconductors) in 2002, it is described that a line space of 0.09 µm will be established by 2004, and accordingly, as to resolving power in a photomask, defect-free and super-resolution are required.

Photomasks are used in a broad range of applications, including the fabrication of semiconductor integrated circuit (IC), large-scale integration (LSI) and very-large-scale integration (VLSI) chips. They are basically constructed by starting with a photomask blank comprising a transparent substrate and a light-shielding film made primarily of chromium thereon and processing the light-shielding film by photolithography using UV radiation or electron beams for thereby forming a desired pattern on the film. The market demand for ever higher levels of integration in semiconductor integrated circuits has led to a rapid reduction in the minimum feature size of photomask patterns. Such miniaturization has been achieved in part by the use of shorter wavelength exposure light.

Although exposure using shorter wavelength light does improve resolution, it has undesirable effects, such as reducing the focal depth, lowering process stability and adversely impacting product yield.

One pattern transfer technique that has been effective for resolving such problems is phase shifting. This involves the use of a phase shift mask as the mask for transferring microscopic circuit patterns.

And, an optical proximity correction (OPC) method has also been utilized in addition to the phase shifting to improve resolving power.

As shown in FIGS. 9A and 9B, a phase shift mask (typically, halftone phase shift mask) is generally composed of a substrate 1 on which a phase shift film 2 has been patterned. The mask has both exposed substrate areas 1a on which there is no phase shift film, and phase shifters 2a that form a pattern region on the mask. The phase shift mask improves the contrast of a transferred image by providing a phase difference of 180 degrees between light passing through the pattern region and light passing through the non-pattern region, and utilizing the destructive interference of light at the boundary regions of the pattern to set the light intensity in the areas of interference to zero. The use of phase shifting also makes it possible to increase the focal depth at the necessary resolution. Hence, compared with a conventional mask having an ordinary light-shielding pattern such as chromium film, the phase shift mask can improve resolution and increase the margin of the exposure process.

For practical purposes, such phase shift masks can be broadly categorized, according to the light-transmitting characteristics of the phase shifter, as either completely transmitting phase shift masks or halftone phase shift masks. Completely transmitting phase shift masks are masks in which the phase shifter has the same light transmittance as the substrate, and which are thus transparent to light at the exposure wavelength. In halftone phase shift masks, the phase shifter has a light transmittance that ranges from about several percent to several tens of percent the transmittance of exposed substrate areas.

FIG. 3 shows the basic structure of a halftone phase shift mask blank, and FIG. 4 shows the basic structure of a halftone phase shift mask. The halftone phase shift mask blank shown in FIG. 3 includes a transparent substrate 1 and a halftone phase shift film 2 formed over the substantially entire surface of the substrate 1. The halftone phase shift mask shown in FIG. 4 is arrived at by patterning the phase shift film 2 of the blank and includes phase shifters 2a, which form the pattern regions of the mask, on the substrate 1 and exposed substrate areas 1a on which there is no phase shift film. Exposure light that has passed through the phase shifter 2a is phase-shifted relative to exposure light that has passed through the exposed substrate area 1a. The transmittance of the phase shifter 2a is selected such that exposure light which has passed through the phase shifter 2a has too low an intensity to exposure the resist on the substrate to which the pattern is being transferred. Accordingly, the phase shifter 2a functions as substantially shield against the exposure light.

Halftone phase shift masks of the above type encompass halftone phase shift masks of the single-layer type which are simple in structure and easy to manufacture. Single-layer halftone phase shift masks which have a phase shifter composed of a molybdenum silicide material such as MoSiO or MoSiON were proposed (see Japanese Patent Application Laid-open (kokai) No. 7-140635, for example).

The important matter is that phase shift mask blanks used in such phase shift masks must satisfy optical characteristics such as a transmittance, a phase difference, a reflectance, and a refractive index at exposure light, and at the same time, they must have durability such as chemical resistance, and few defects.

However, when optical characteristics of the phase shift film used in the above halftone phase shift mask of the single-layer type are set at desired values, the composition of the film is univocally determined. Therefore, it is difficult to produce a phase shift film satisfied with the other characteristics required.

In order to avoid this problem, it has been considered that multiple layers of phase shift films (multilayer phase shift film) including layers for satisfying optical characteristics and layers for satisfying the other characteristics such as chemical resistance are formed. However, an actual composition and a structure of the films possible to satisfy optical characteristics and chemical resistance were not known.

Also, a phase shift film is generally formed by a sputtering method. In the method, the phase shift film is formed with a single target such as a metal silicide made by adjusting the composition of metal and silicon, and mixing and sintering them so as to obtain a desired transmittance in the film. However, since the ratio of metal and silicon in the phase shift film produced by the above method depends on the composition of a target, only a single film corresponding to the target can be formed.

In order to increase the transmittance of the phase shift film in such circumstances, there are proposed a method of increasing an oxygen content in the phase shift film and a method of increasing a silicon content therein.

In the case of the method of increasing an oxygen content in the phase shift film, the oxygen content can be increased by increasing a flow rate of gas containing oxygen flown during forming the film by a sputtering method. However, there is a problem that as the oxygen content in the film is increased, its chemical resistance against a cleaning liquid used for cleaning the film is degraded. There is also a problem that as the oxygen content in the film is increased, the refractive index of the film is decreased, and the film thickness for obtaining a phase difference of 180 degrees becomes thicker.

And, in order to increase a silicon content in the phase shift film, there is a method of increasing the ratio of silicon in a metal silicide target used as a sputtering target. However, this method needs to prepare targets depending on each specification of transmittances of phase shift films. Since metal silicide targets are very expensive, this method is not preferred in consideration of production cost and productivity.

Also, when targets are produced, in a region where a ratio of silicon is high in a target, silicon and metal are not evenly dispersed in the target, so that the dispersion is easily unbalanced. When a phase shift film is formed by a sputtering method with the target of which compositions are not evenly dispersed, abnormal discharge easily occurs, and defects are easily generated in the phase shift film to be formed.

Moreover, when the phase shift mask blank having a multilayer phase shift film as described above is produced, each layer of phase shift films is generally formed on a transparent substrate in order by the sputtering method. In this case, plural different targets for forming each layer of the phase shift films are prepared in a film forming chamber of a sputtering apparatus, and each layer of the phase shift films are formed by discharging respective targets corresponding to each layer.

However, there has been a problem that as the number of layers of phase shift films are increased, defects and particles are easily generated in the phase shift films. Accordingly, there was a problem that in the production of a phase shift mask blank having a multilayer phase shift film, it is difficult to produce a phase shift mask blank having few defects.

SUMMARY OF THE INVENTION

The present invention has been accomplished to solve the above-mentioned problems, and the first object of the present invention is to provide a method of producing a phase shift mask blank, a phase shift mask blank, a method of producing a phase shift mask, and a phase shift mask wherein a phase shift film having desired transmittances can be easily obtained without changing a target into another target having a different composition therefrom when each phase shift film having different transmittances is formed, and a phase shift film having good chemical resistance can be obtained.

And, the second object of the present invention is to provide a phase shift mask blank having desired optical characteristics, good chemical resistance, and few defects, a phase shift mask made by using the phase shift mask blank, and methods of producing them.

Moreover, the third object of the present invention is to provide methods of producing a phase shift mask blank and a phase shift mask having multiple layers of phase shift films wherein the phase shift films have few defects.

To achieve the above objects, according to the present invention, there is provided a method of producing a phase shift mask blank wherein the method includes at least a step of forming one or more layers of phase shift films on a substrate by a sputtering method, and in the step, the phase shift films are formed by the sputtering method while simultaneously discharging plural targets having different compositions.

As described above, since the phase shift film is formed by the sputtering method by simultaneously discharging plural targets having different compositions, it is not necessary to change a target into another target having a different composition therefrom, and therefore, a phase shift mask blank comprising the phase shift film having desired composition and desired quality can be easily produced. And, in particular, in the case of forming multiple layers of phase shift films, since plural targets are simultaneously discharged, the targets are stably discharged when the phase shift films are formed by the sputtering method, and therefore, a phase shift mask blank having the phase shift films with few defects can be produced.

Namely, first, the first embodiment of the present invention is a method of producing a phase shift mask blank wherein the method includes at least a step of forming one or more phase shift film on a substrate by a sputtering method, and in the step, the phase shift film is formed by the sputtering method by simultaneously discharging at least one or more silicon target and one or more target selected from the group consisting of a metal silicide, a metal silicide oxide, a metal silicide nitride, a metal silicide oxide nitride, a metal silicide oxide carbide, a metal silicide nitride carbide, and a metal silicide oxide nitride carbide.

As described above, since the phase shift film is formed by the sputtering method by simultaneously discharging a silicon target and a target such as a metal silicide, its transmittance can be easily changed and adjusted by controlling compositions of metal and silicon in the phase shift film so as to obtain a certain composition ratio without changing a target into another target having a different composition therefrom. And, since it is not necessary to specially increase an oxygen content in the phase shift film, a phase shift mask blank comprising the phase shift film having good chemical resistance can be produced.

In this case, it is preferable that the composition ratio of metal and silicon in the phase shift film is changed by adjusting discharge powers applied to each target.

As described above, in the present invention, only by adjusting the discharge powers applied to each target, the compositions in the phase shift film can be changed, and therefore, the phase shift film having desired characteristics can be easily obtained.

In this case, it is preferable that the metal component of the target is molybdenum.

As described above, if a metal component of the target is molybdenum, i.e., if the target is a molybdenum silicide, a molybdenum silicide oxide, a molybdenum silicide nitride, a molybdenum silicide oxide nitride, a molybdenum silicide oxide carbide, a molybdenum silicide nitride carbide, or a molybdenum silicide oxide nitride carbide, a high quality phase shift film can be formed since these targets which are dense and high purity are easy to be obtained.

In this case, when the phase shift film is formed by the sputtering method, a gas containing one or more elements selected from oxygen, nitrogen and carbon as a constituent element can be used as a sputtering gas.

As described above, when the phase shift film is formed by the sputtering method, a gas containing one or more elements selected from oxygen, nitrogen and carbon as a constituent element is used as a sputtering gas as well as a target to which oxygen, nitrogen, or carbon is previously added is used, a desired amount of oxygen, nitrogen, or carbon can be contained in the phase shift film, and thereby the transmittance of the phase shift film can be adjusted.

And the present invention is a phase shift mask blank produced by the above production method of the present invention.

As described above, the phase shift mask blank produced by the production method of the present invention has a desired transmittance and good chemical resistance.

Moreover, the present invention is a method of producing a phase shift mask wherein a pattern is formed by a lithography method on the phase shift film of the phase shift mask blank produced by the production method of the present invention.

As described above, if a pattern is formed by a lithography method on the phase shift film of the phase shift mask blank produced by the production method of the present invention, the phase shift mask blank produced by the production method of the present invention has a desired transmittance and good chemical resistance. Therefore, when a pattern is formed by a lithography method thereon, a phase shift mask having stable quality can be produced without change in its characteristics.

And the present invention is a phase shift mask blank wherein at lest one or more phase shift films are formed on a substrate, the phase shift films contain at least metal and silicon as constituent elements, and the phase shift films are formed by a sputtering method by simultaneously discharging at least one or more silicon target and one or more target selected from the group consisting of a metal silicide, a metal silicide oxide, a metal silicide nitride, a metal silicide oxide nitride, a metal silicide oxide carbide, a metal silicide nitride carbide, and a metal silicide oxide nitride carbide.

As described above, if the phase shift film is formed by the sputtering method by simultaneously discharging at least one or more silicon target and one or more target selected from the group consisting of a metal silicide, a metal silicide oxide, a metal silicide nitride, a metal silicide oxide nitride, a metal silicide oxide carbide, a metal silicide nitride carbide, and a metal silicide oxide nitride carbide, the phase shift film has a desired transmittance and good chemical resistance.

In this case, the phase shift film comprises any one of a metal silicide, a metal silicide oxide, a metal silicide nitride, a metal silicide oxide nitride, a metal silicide oxide carbide, a metal silicide nitride carbide, and a metal silicide oxide nitride carbide.

As described above, if the phase shift film comprises a metal silicide, a metal silicide oxide, a metal silicide nitride, a metal silicide oxide nitride, a metal silicide oxide carbide, a metal silicide nitride carbide, or a metal silicide oxide nitride carbide, the phase shift film can have a desired transmittance.

In this case, it is preferable that a metal component of the phase shift film is molybdenum.

As described above, if a metal component of the phase shift film is molybdenum, i.e., the phase shift film comprises a molybdenum silicide, a molybdenum silicide oxide, a molybdenum silicide nitride, a molybdenum silicide oxide nitride, a molybdenum silicide oxide carbide, a molybdenum silicide nitride carbide, or a molybdenum silicide oxide nitride carbide, since these molybdenum silicide targets which are dense and high purity and which are used for forming phase shift films containing each molybdenum by a sputtering method, are easily obtained, the phase shift film has high quality.

In this case, it is preferable that a center value of a distribution of phase differences in the phase shift film to wavelength of light used in exposure is 180°±10°, and a center value of a distribution of transmittances in the phase shift film is 3-40%.

As described above, if a center value of a distribution of phase differences in the phase shift film to wavelength of light used in exposure is 180°±10°, and a center value of a distribution of transmittances thereof is 3-40%, a halftone phase shift mask blank having a light shielding function for substantially shielding exposure light can be obtained.

In this case, it is preferable that a distribution of phase differences in the phase shift film to wavelength of light used in exposure is within ±1.5°, and a distribution of transmittances in the phase shift film is within ±0.15%.

As described above, since the phase shift film in which a distribution of phase differences to wavelength of light used in exposure is within ±1.5°, and in which a distribution of transmittances is within ±0.15% can be obtained, a phase shift mask blank having little variation of characteristics, i.e., stable characteristics on the whole surface of the phase shift film can be obtained.

And, the present invention is a phase shift mask wherein a pattern is formed on the phase shift film of the phase shift mask blank of the present invention.

Since the phase shift mask wherein a pattern is formed on the phase shift film of the phase shift mask blank of the present invention has a desired transmittance and good chemical resistance, its characteristics can not be changed even by cleaning or the like when forming a pattern on the phase shift mask, and thus, a phase shift mask having stable quality can be obtained.

Next, the second embodiment of the present invention is a phase shift mask blank wherein the phase shift mask blank comprises at least a multilayer phase shift film composed of two or more layers of phase shift films on a substrate, the multilayer phase shift film comprises a metal silicide compound, and a metal content in an outermost layer of the phase shift film in the multilayer phase shift film is 1/20-1/3 (molar ratio) of a metal content of a phase shift film which contains the most metal among the phase shift films in the multilayer phase shift film.

As described above, if the phase shift mask blank comprises a multilayer phase shift film formed on a substrate, the multilayer phase shift film comprises a metal silicide compound, and a metal content in an outermost layer of the phase shift film in the multilayer phase shift film is 1/20-1/3 (molar ratio) of a metal content of a phase shift film which contains the most metal among the phase shift films in the multilayer phase shift film, a phase shift mask blank having good chemical resistance and few defects while its optical characteristics are satisfied can be obtained.

In this case, it is preferable that the metal silicide compound comprises a metal silicide and a compound of oxygen and/or nitrogen.

As described above, if the metal silicide compound comprises a metal silicide and a compound of oxygen and/or nitrogen, a phase shift mask blank of which each layer of the multilayer phase shift film has desired characteristics such as a transmittance, chemical resistance, and the like can be obtained.

In this case, it is preferable that the metal silicide compound comprises a compound of a molybdenum silicide.

As described above, if the metal silicide compound comprises a compound of a molybdenum silicide, since a molybdenum silicide target, which is dense and high purity, used for forming the phase shift film containing molybdenum by sputtering is easy to be obtained, a high quality multilayer phase shift film can be preferably formed.

In this case, a Cr base light shielding film and/or a Cr base antireflection film can be formed on the multilayer phase shift film.

As described above, since a Cr base light shielding film and/or a Cr base antireflection film is formed on the multilayer phase shift film, a patterning can be further precisely performed and the phase shift mask blank can cope sufficiently with further miniaturization and high integration of semiconductor integrated circuits.

And, the present invention is a phase shift mask wherein a pattern is formed on the multilayer phase shift film of the phase shift mask blank of the present invention.

Since the phase shift mask blank of the present invention comprises the multilayer phase shift film having desired optical characteristics, good chemical resistance, and few defects, the phase shift mask made by forming a pattern on the phase shift mask blank can have high quality.

And, the present invention is a method of producing a phase shift mask blank wherein the method includes at least a step of forming a multilayer phase shift film composed of two or more layers of phase shift films comprising a metal silicide compound on a substrate by a sputtering method, in the step, the sputtering film formation is performed with plural targets having a different composition ratio between metal and silicon in components and with a sputtering gas containing at least oxygen and/or nitrogen, and by changing a combination of each discharge power applied to the plural targets, the multilayer phase shift film in which a metal content in an outermost layer of the phase shift film is 1/20-1/3 (molar ratio) of a metal content of a phase shift film which contains the most metal among the phase shift films in the multilayer phase shift film is formed.

As described above, when the multilayer phase shift film composed of multiple layers is formed on the substrate by a sputtering method with plural targets having a different composition ratio between metal and silicon, and by changing a combination of each electric power applied to the plural targets, a metal content in an outermost layer of the phase shift film in the multilayer phase shift film can be 1/20-1/3 (molar ratio) of a metal content of a phase shift film which contains the most metal among the phase shift films in the multilayer phase shift film. Accordingly, a multilayer phase shift film having desired optical characteristics, few defects, and good chemical resistance can be formed.

In this case, it is preferable that at least one or more metal silicide target and one or more silicon target are used as the plural targets.

As described above, since at least one or more metal silicide target and one or more silicon target are used as the plural targets, a composition ratio of metal and silicon in the multilayer phase shift film is adjusted to a certain ratio, and thereby, characteristics such as a transmittance and chemical resistance of each layer of the multilayer phase shift film can be easily changed and adjusted.

In this case, it is preferable that a metal component of the metal silicide target contains molybdenum.

Since a molybdenum silicide target containing molybdenum which is dense and high purity is easily obtained, a high quality multilayer phase shift film can be preferably formed.

In this case, it is preferable that in the case of forming the multilayer phase shift film with the plural targets by a sputtering method, when any one layer in the multilayer phase shift film is formed, targets used for forming the layer is discharged with a required discharge power to form the layer, and when the other layers in the multilayer phase shift film are formed, the discharge power is lowered to 1/20 or more of the required discharge power, so that all of targets used for forming the multilayer phase shift film are continuously discharged without shutdown of the discharge.

As described above, in the case of forming all layers of the multilayer phase shift film, even when the other layers in the multilayer phase shift film are formed, a target used at least once is continuously discharged while a discharge power is lowered to 1/20 or more of a normal discharge power, and thereby, discharge instability at starting and finishing in the above sputtering film formation is solved, so that generation of particles can be prevented and generation of defects in the multilayer phase shift film can be prevented.

And the present invention is a method of producing a phase shift mask wherein a pattern is formed by a lithography method on the multilayer phase shift film of the phase shift mask blank produced by the production method of the present invention.

As described above, as for the phase shift mask blank produced by the production method of the present invention, since the multilayer phase shift film has desired optical characteristics, good chemical resistance, and few defects, a high quality phase shift mask can be produced by forming a pattern by a lithograph method on the multilayer phase shift film.

Next, the third embodiment of the present invention is a method of producing a phase shift mask blank wherein the method includes at least a step of forming two or more layers of phase shift films, each of which has a different composition from the others, on a substrate in order by a sputtering method with two or more targets, and in the step, each layer of the phase shift films is formed by continuously discharging all targets used for forming any one of the layers of the phase shift films without shutdown even when the other layers of the phase shift films are formed.

As described above, in the method of producing a phase shift mask blank wherein two or more layers of phase shift films having different compositions are formed on a substrate in order by a sputtering method using two or more targets, a target used at least once for forming any one of layers of the phase shift films is continuously discharged even when the other layers of the phase shift films are formed, and thereby, the discharge in the sputtering film formation is stabilized. As a result, a phase shift mask blank having phase shift films with few defects can be produced.

In this case, in the step of forming each layer of the phase shift films, it is preferable that when any one of layers of the phase shift films is formed with targets used for forming the layer, the targets are discharged with a required discharge power to form the phase shift film, and when the other layers of the phase shift films are formed, the targets are continuously discharged while the discharge power is lowered.

As described above, when any one of layers of the phase shift films is formed with targets for forming the layer of the phase shift film, the targets are discharged with a required discharge power to form the phase shift film, and when the other layers of the phase shift films are formed, the targets are continuously discharged with a lowered discharge power, and thereby, each layer of the phase shift films can have desired compositions.

In this case, the phase shift films comprising a metal element, Si, N, and O as constituent elements are formed.

As described above, by the method of the present invention, the phase shift films comprising a metal element, Si, N, and O as constituent elements are formed, and thereby, the phase shift films having few defects, desired optical characteristics, and chemical resistance can be formed.

In this case, it is preferable that the metal element serving as a constituent element of the phase shift films is Mo.

As described above, in the case that the metal element among constituent elements in the phase shift films is Mo, since, for example, a molybdenum silicide target which is dense and high purity used for forming a phase shift film containing Mo by a sputtering method is easily obtained, high quality phase shift films can be preferably formed.

And the present invention is a phase shift mask blank produced by the production method of the present invention.

As described above, as for the phase shift mask blank produced by the production method of the present invention, since the discharge to the target is stable when the phase shift films are formed by a sputtering method, the phase shift mask having few defects can be obtained.

Moreover, the present invention is a method of producing a phase shift mask wherein a pattern is formed by a lithography method on the phase shift films of the phase shift mask blank produced by the production method of the present invention.

As described above, if a pattern is formed by a lithography method on the phase shift films of the phase shift mask blank produced by the production method of the present invention to form a phase shift mask, a high quality phase shift mask of which the phase shift films have few defects can be produced.

And the phase shift mask blank produced by the production method of the present invention is a phase shift mask blank, for example, comprising two or more layers of phase shift films having different compositions on a substrate, and each of the two or more layers of the phase shift films contains 1-10% of compositions of adjacent layers.

As described above, in the phase shift mask comprising two or more layers of phase shift films having different compositions on a substrate and containing 1-10% of compositions of adjacent layers of the phase shift films, since each layer of the phase shift films is formed under stable discharge in sputtering without shutdown of the discharge to the targets used to form the films, a high quality phase shift mask blank wherein each layer of the phase shift films has few defects can be obtained.

In this case, the phase shift films may comprise a metal element, Si, N, and O as constituent elements and the metal element may be Mo.

As described above, if the phase shift films comprise a metal element, Si, N, and O as constituent elements, phase shift films having desired optical characteristics and chemical resistance can be obtained. In particular, if the metal element in the constituent elements is Mo, a molybdenum silicide target, which is dense and high purity, used to form the phase shift films by a sputtering film containing Mo is easily obtained, high quality phase shift films can be obtained.

And, in the phase shift mask wherein a pattern is formed on the phase shift film of the phase shift mask blank of the present invention, since each layer of the phase shift films has few defects even though multiple layers of the phase shift films are formed, a high quality phase shift mask can be obtained.

As described above, according to the present invention, when phase shift films having different transmittances are formed, desired transmittances can be easily obtained without changing the targets into targets having different compositions, and a phase shift mask blank and a phase shift mask having phase shift films with good chemical resistance can be produced.

Also, according to the present invention, as for the phase shift mask blank comprising a multilayer phase shift film constituted by multiple layers on a substrate, a phase shift mask blank and a phase shift mask having desired optical characteristics, chemical resistance, and few defects can be produced.

Moreover, according to the present invention, a phase shift mask blank and a phase shift mask comprising multiple layers of phase shift films wherein each layer of the phase shift films has extremely few defects can be provided.

BRIEF DESCRIPTION OF THE DRAWINGS

FIG. 8(A) shows a state of forming a resist film; FIG. 8(B) shows a state of patterning the resist film; FIG. 8(C) shows a state of etching a phase shift film; and FIG. 8(D) is a schematic sectional view showing a state of eliminating the resist film.

FIG. 9(B) is a partially-enlarged view of a region X in FIG. 9(A).

FIG. 17(A) shows a state of forming a resist film; FIG. 17(B) shows a state of pattering the resist film; FIG. 17(C) shows a state of etching phase shift films; and FIG. 17(D) shows a state of eliminating the resist film.

DETAILED DESCRIPTION OF THE PREFERRED EMBODIMENTS

Hereinafter, the present invention will be described further in detail.

The present invention is a method of producing a phase shift mask blank wherein the method includes at least a step of forming one or more phase shift films on a substrate by a sputtering method, and in the step, the phase shift films are formed by the sputtering method while simultaneously discharging plural targets having different compositions.

As described above, since the phase shift film is formed by the sputtering method while simultaneously discharging plural targets having different compositions, one target can be used without purposely changing it into a target having another composition, and thereby, a phase shift mask blank comprising a phase shift film having a desired composition and a desired quality can be easily produced. And, in particular, since plural targets are simultaneously discharged when forming multiple layers of phase shift films, the discharge in the sputtering film formation can be stabilized, and thereby, a phase shift mask blank comprising phase shift films having few defects can be produced.

First, the first embodiment of the present invention as described above will be explained.

Through assiduous studies for solving the above problems, inventors of the present invention found that when a phase shift film is formed by a sputtering method, in the case that a composition ratio of metal and silicon in the phase shift film can be appropriately controlled by simultaneously discharging a silicon target, a metal silicide target, and the like, its transmittance can be easily adjusted without change in compositions of the targets. And, the inventors of the present invention also found that since, according to this method, it is not necessary to increase an oxygen content in the phase shift film, a phase shift film having good chemical resistance and high quality can be obtained. Accordingly, they accomplished the present invention.

Figure 2:
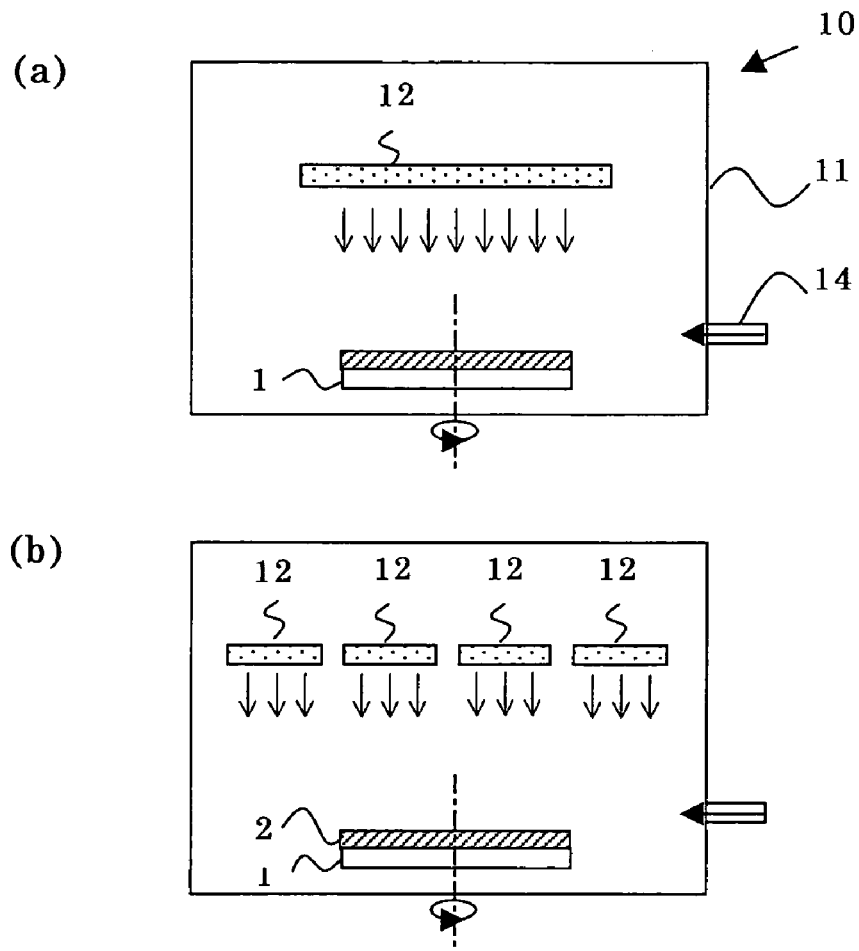
FIGS. 2(a)-(b) are drawings showing a conventional production method of a phase shift mask blank.

As shown in FIG. 2, in a conventional production method of the phase shift mask blank, compositions of metal and silicon were adjusted to obtain a desired transmittance, a single target 12 comprising a mixed and sintered metal silicide and the like (FIG. 2(a)) or plural targets 12 comprising one kind of a metal silicide and the like (FIG. 2(b)) was disposed in a chamber 11 of a sputtering apparatus 10, and the phase shift film was formed. In the above method, only a phase shift film having a single ratio of metal and silicon in accordance with the composition of the target used, and therefore, the transmittance of the phase shift film can not be easily adjusted.

In a method wherein an oxygen content in a sputtering gas introduced from a sputtering gas inlet 14 is increased or decreased to adjust the transmittance of the phase shift film, the chemical resistance of a phase shift film 2 is degraded and there is a disadvantage that the phase shift film becomes thicker since a reflective index thereof is decreased. And, in a method wherein a ratio of silicon in the target 12 is increased or decreased, since it is necessary to prepare expensive metal silicide targets and exchange them in accordance with a desired transmittance of phase shift films, there is a disadvantage of production costs. Also, when the target 12 of which silicon content ratio is high is used for forming a phase. shift film, there is a disadvantage that defects are easily generated in the phase shift film due to abnormal discharge.

Accordingly, inventors of the present invention conceived that a phase shift film should be formed by simultaneously discharging a silicon target and a target such as a metal silicide target. It has not been conceived conventionally that when a phase shift film is formed by a sputtering method, not only a metal silicide target and the like but also a silicon target are simultaneously discharged. If the film is formed in this manner, by separately adjusting each discharge power applied to each metal silicide target and silicon target, a ratio of metal and silicon in the phase shift film to be formed can be easily adjusted to achieve a desired transmittance without change of compositions of the targets.

In this case, if a silicon content in the phase shift film is increased, the transmittance of the phase shift film can be increased, in particular, in terms of short wavelength light. And, since it is not necessary to use a target of which silicon content is high in order to increase the transmittance, the problem of abnormal discharge does not occur. Moreover, in this method, since a desired transmittance can be obtained without increase of an oxygen content in a phase shift film, the phase shift film having good chemical resistance can be formed.

Hereinafter, the first embodiment of the present invention will be explained in detail in reference to drawings, but the present invention is not limited thereto.

Figure 3:
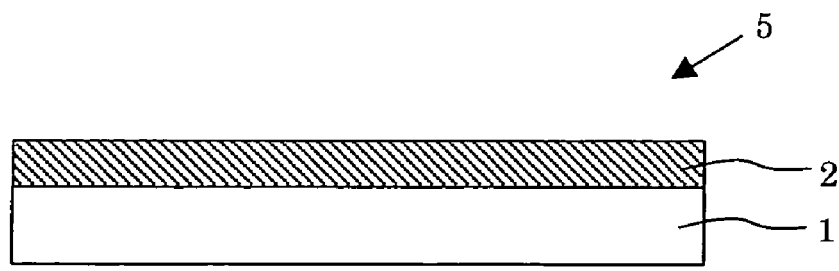
FIG. 3 shows a structure of a phase shift mask blank.

As shown in FIG. 3, in the basic structure of the phase shift mask blank of the present invention, one phase shift film 2 is formed with a sputtering apparatus on a substrate 1 made of quartz, $CaF_2$, or the like through which exposure light can transmit. And, there can be provided a phase shift mask blank wherein a distribution of a phase difference (that is, a phase difference between incident exposure light and light shifted by the phase shift film) in the substrate (that is, each position through which exposure light transmits) is within ±1.5°, and a distribution of a transmittance in the substrate is within ±0.1°. Thus, since such a phase shift mask blank has small variance of characteristics therein, the phase shift mask blank has stable characteristics.

At this point, in a phase shift mask blank 5 of the present invention, a phase shift film 2 is formed by simultaneously discharging at least one or more silicon target and one or more target such as a metal silicide by a sputtering method. Accordingly, since the phase shift film 2 has a high transmittance but its oxygen content is not extremely increased, the phase shift film 2 has a proper refractive index, and thus, its thickness becomes thinner. Also, the phase shift film 2 has good chemical resistance. And since when the phase shift film is formed, a metal silicide target of which silicon content is high is not used to increase the transmittance of the film, defects due to abnormal discharge are not generated in the phase shift film.

As for the phase shift film 2, it is preferable that the film contains at least metal and silicon as constituent elements, and the film is formed by a well-known metal silicide, metal silicide oxide, metal silicide nitride, metal silicide oxide nitride, metal silicide oxide carbide, metal silicide nitride carbide, or metal silicide oxide nitride carbide, in particular, molybdenum silicide, molybdenum silicide oxide (MoSiO), molybdenum silicide nitride (MoSiN), molybdenum silicide oxide nitride (MoSiON), molybdenum silicide oxide carbide (MoSiOC), molybdenum silicide nitride carbide (MoSiNC), or molybdenum silicide oxide nitride carbide (MoSiONC). Since the molybdenum silicide target and the like which is dense and high purity used for forming the phase shift film containing each molybdenum can be easily obtained, a high quality phase shift film can be obtained.

Also, it is preferable that the phase shift film 2 has a center value of a distribution of phase differences of 180°±10°, and has a center value of a distribution of transmittances from several percents to several dozen percents (in particular, the range of 3-40% is preferable). If the film has such characteristics, a halftone phase shift mask blank having a light shielding function to substantially shield exposure light can be obtained.

Figure 4:
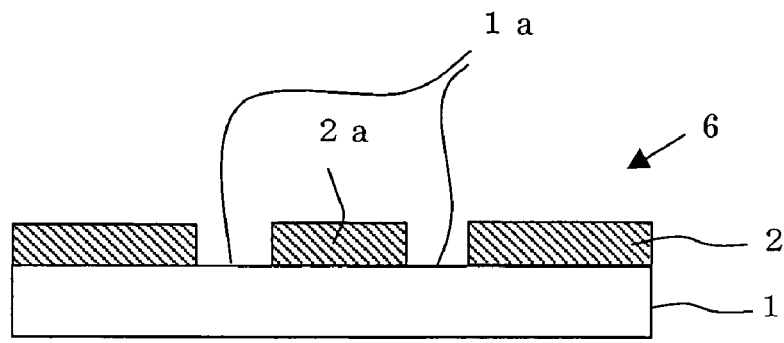
FIG. 4 shows a structure of a phase shift mask.

And as shown in FIG. 4, in the basic structure of the phase shift mask of the present invention, the phase shift mask is obtained by patterning the phase shift film of the phase shift mask blank described above, a patterned phase shifter portion 2a is a second light transmitting portion, and exposed substrate areas 1a are first light transmitting portions.

Hereinafter, a concrete method of producing the phase shift mask blank of the first embodiment of the present invention will be explained.

The phase shift film can be formed with a sputtering apparatus having a cathode which has at least one or more silicon target and one or more target such as a metal silicide, which can be simultaneously discharged, and having a mechanism of rotating a substrate.

Figure 1:
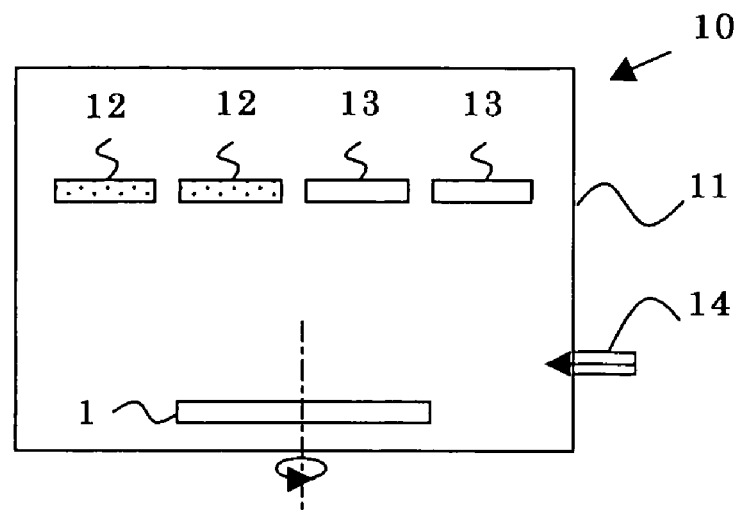
FIGS. 1(a)-(c) are drawings showing a production method of a phase shift mask blank according to the first embodiment of the present invention.
Figure 1:
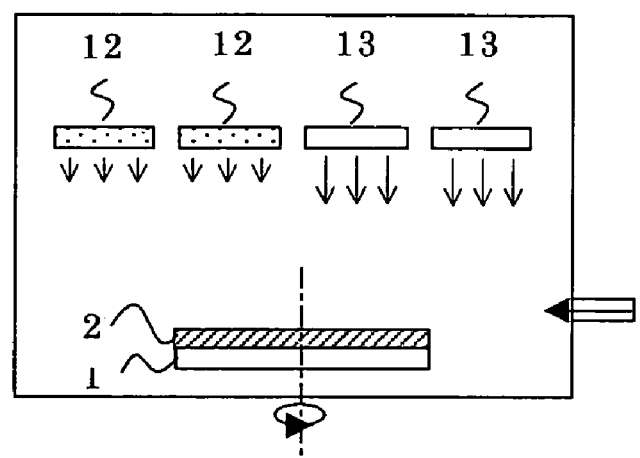
Figure 1:
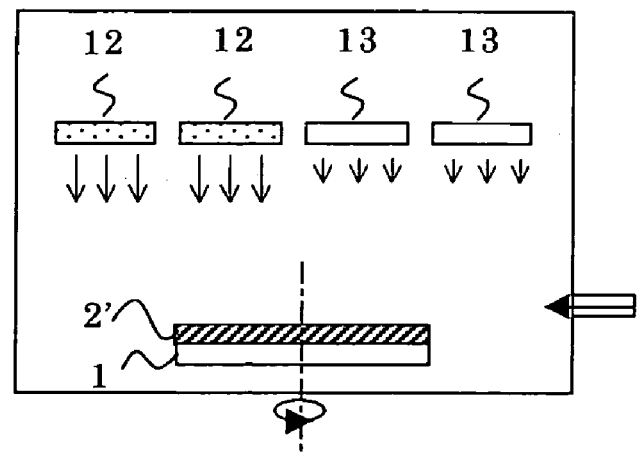

As shown in FIG. 1, in a sputtering apparatus 10, a predetermined sputtering gas is introduced from a sputtering gas inlet 14, a target 12 such as a metal silicide and a silicon target 13 are used while each discharge power can be set independently. When a phase shift film 2 is formed on a substrate 1, by using the target 12 such as a metal silicide and the silicon silicide 13, the each amount of discharge power to the target 12 and the target 13 can be set so that the film has a composition ratio of metal and silicon therein, which can obtain a desired transmittance (FIG. 1(a)). Namely, in the case that it is desired to increase the transmittance of the phase shift film 2, by increasing the discharge power to the silicon target 13 or decreasing the discharge power to the target 12 such as a metal silicide, a ratio of silicon to metal in the phase shift film 2 can be increased, and as the result, the transmittance can be increased (FIG. 1(b)). Similarly, in the case that it is desired to decrease the transmittance of the phase shift film 2, by decreasing the discharge power to the silicon target 13 or increasing the discharge power to the target 12 such as a metal silicide, a ratio of silicon to metal can be increased, and as the result, the transmittance can be decreased (FIG. 1(c)).

In addition, the number of targets and silicon targets are suitably selected, and it does not matter if only a single target such as a metal silicide and a single silicon target are selected. However, either of them may be plural or both of them may be plural in accordance with a film formation rate of each target and silicon target and the value of a required transmittance.

Also, the discharge power to each target such as a metal silicide and silicon target is suitably selected. Although the power is not limited in particular, the range possible to discharge the target such as a metal silicide and the silicon target in a stable state is preferred, and therefore, it is preferable that the discharge power per unit area is 0.2-20 $W/cm^2$.

Although the composition ratio of targets of the metal silicide is not limited in particular, it is preferable that a molar ratio of the metal and silicon is about 1:5 so that the film can be produced stably as stoichiometry compositions. Since the silicon target and the target such as a metal silicide are used at the same time and each discharge power is suitably selected and adjusted, there can be obtained a phase shift film having the same composition as a phase shift film formed with a target of the metal silicide containing rich silicon.

It is preferable that the phase shift film is formed on a substrate while rotating the substrate, so that the film can have a uniform composition distribution in its plane. It is also preferable that a rotating velocity of the substrate when forming the film is 5-50 rpm.

As for the film formation method of the phase shift film of the present invention, well-known methods can be adopted in addition to the above method. In particular, the phase shift film is preferably formed by a reactive sputtering method. As to the sputtering targets used therein, when forming the phase shift film comprising a metal silicide, a metal silicide oxide, a metal silicide nitride, a metal silicide oxide nitride, a metal silicide oxide carbide, a metal silicide nitride carbide, or a metal silicide oxide nitride carbide, the target containing the metal to be contained in the film to be formed and a silicon target are used. In particular, when forming the phase shift film comprising a molybdenum silicide, a molybdenum silicide oxide, a molybdenum silicide nitride, a molybdenum silicide oxide nitride, a molybdenum silicide oxide carbide, a molybdenum silicide nitride carbide, or a molybdenum silicide oxide nitride carbide, the target of which metal component is molybdenum and a silicon silicide are used. Moreover, a target to which oxygen, nitrogen, or carbon, or the combination thereof are added in order to keep the composition of the film constant and which have the same composition as the above phase shift film to be formed may be used.

In the present invention, the sputtering apparatus may employ a direct-current power supply or a high-frequency power supply, and may employ a magnetron sputtering system, a conventional sputtering system, or the like.

The sputtering gas may contain an inert gas such as argon or xenon, to which one or more gases selected from nitrogen gas, oxygen gas, various nitrogen oxide gases, carbon monoxide gas, and carbon dioxide gas are suitably added so that the phase shift film may have a desired composition, and thereby, the resultant phase shift film can contain oxygen, nitrogen, and carbon.

Where it is desired to increase the transmittance of a phase shift film to be formed, it is recommended that the amounts of oxygen and nitrogen-containing gases added to the sputtering gas are increased, or a metal silicide having more oxygen and nitrogen previously added thereto is used as the sputtering target so that more oxygen and nitrogen are taken into the film. However, if too much oxygen is added thereto, there is an adverse effect that chemical resistance of the phase shift film to be formed is degraded, and due to decrease of a refractive index, the film for shifting phase by 180 degrees must be thicker. Therefore, it is preferable that the transmittance is increased by relatively increasing discharge power to a silicon target while the amount of oxygen to be added is not changed from a certain amount.

As for the phase shift mask blank of the present invention, the phase shift film may include two or more, i.e., multiple layers by changing the film formation conditions.

Figure 5:
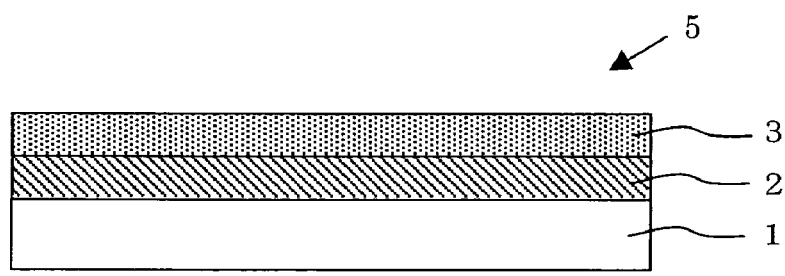
FIG. 5 is a structure of a phase shift mask blank having a Cr base light shielding film according to the first embodiment of the present invention.
Figure 6:
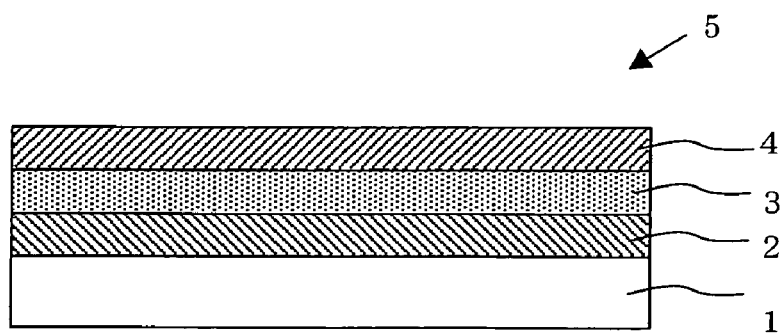
FIG. 6 shows a structure of a phase shift mask blank having a Cr base light shielding film and a Cr base antireflection film according to the first embodiment of the present invention.
Figure 7:
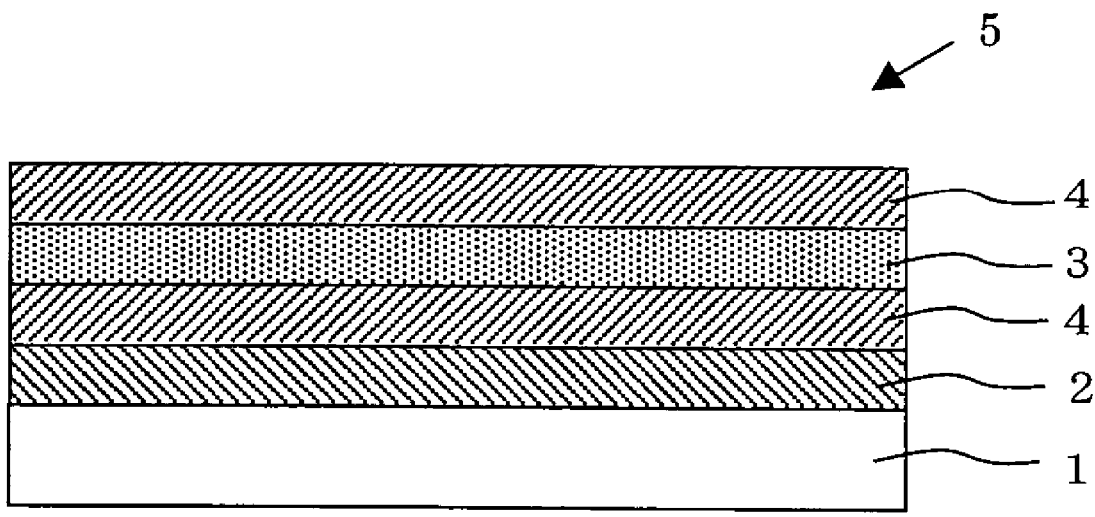
FIG. 7 shows another structure of a phase shift mask blank according to the first embodiment of the present invention.

And, as shown in FIG. 5, a phase shift film 2 and a Cr base light shielding film 3 may be formed on a substrate 1 in order. Alternatively, as shown in FIG. 6, a phase shift film 2, a Cr base light shielding film 3, and a Cr base antireflection film 4 for lowering the reflection of light from the Cr base light shielding film 3, may be formed on a substrate 1 in order. Moreover, as shown in FIG. 7, a phase shift film 2, a first Cr base antireflection film 4, a Cr base light shielding film 3, and a second Cr base antireflection film 4' may be formed on a substrate 1 in order.

In this case, it is preferable to use chromium oxide carbide (CrOC), chromium oxide nitride carbide (CrONC) or a laminate thereof for the Cr base light shielding film or the Cr base antireflection film.

Such a Cr base light shielding film or a Cr base antireflection film can be formed with a target of chromium itself or a target wherein oxygen, nitrogen, or carbon, or combination thereof is added to chromium, and by a reactive sputtering method with a sputtering gas wherein a carbon dioxide gas is added as a carbon source to an inert gas such as argon or krypton.

To be more precise, when the CrONC film is formed, one or more gases selected from a gas containing carbon such as $CH_4$, $CO_2$, or CO, a gas containing nitrogen such as NO, $NO_2$, $N_2$, and a gas containing oxygen such as $CO_2$, NO or $O_2$, or a gas wherein the above gases are mixed with an inert gas such as Ar, Ne, or Kr may be introduced as a sputtering gas. In particular, it is preferable to use a carbon dioxide gas as a carbon source and oxygen source gas in terms of uniformity in the film and controllability in the formation of the film. As to the gas introduction method, various sputtering gases may be separately introduced, or a gas wherein several gases or all of gases as above are mixed and may be introduced into a chamber.

The phase shift mask according to the first embodiment of the present invention is obtained by forming a pattern on the phase shift film of the phase shift mask blank obtained as described above.

Figure 8:
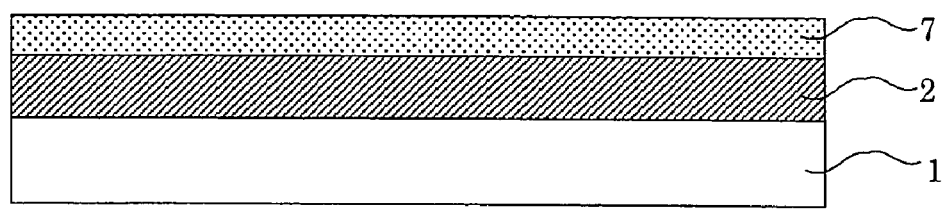
FIG. 8 includes explanatory views showing a production method of a phase shift mask.
Figure 8:
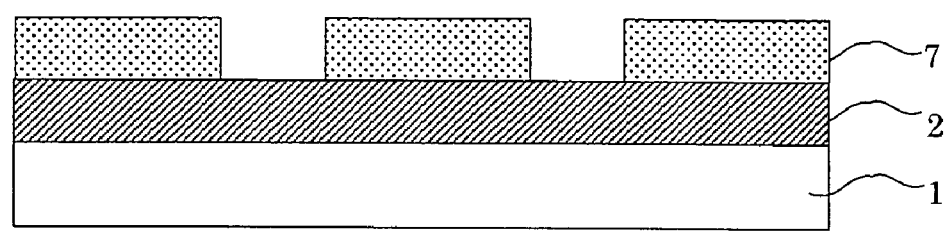
Figure 8:
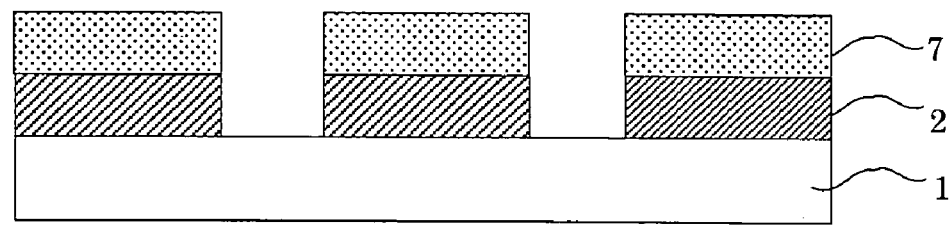
Figure 8:
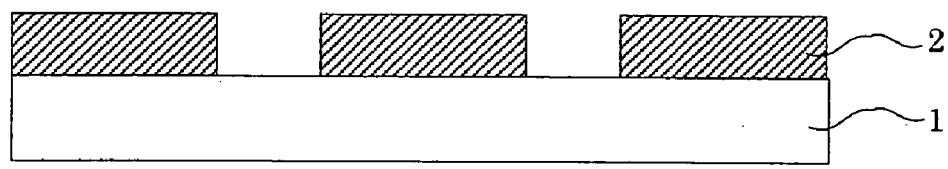
Figure 9:
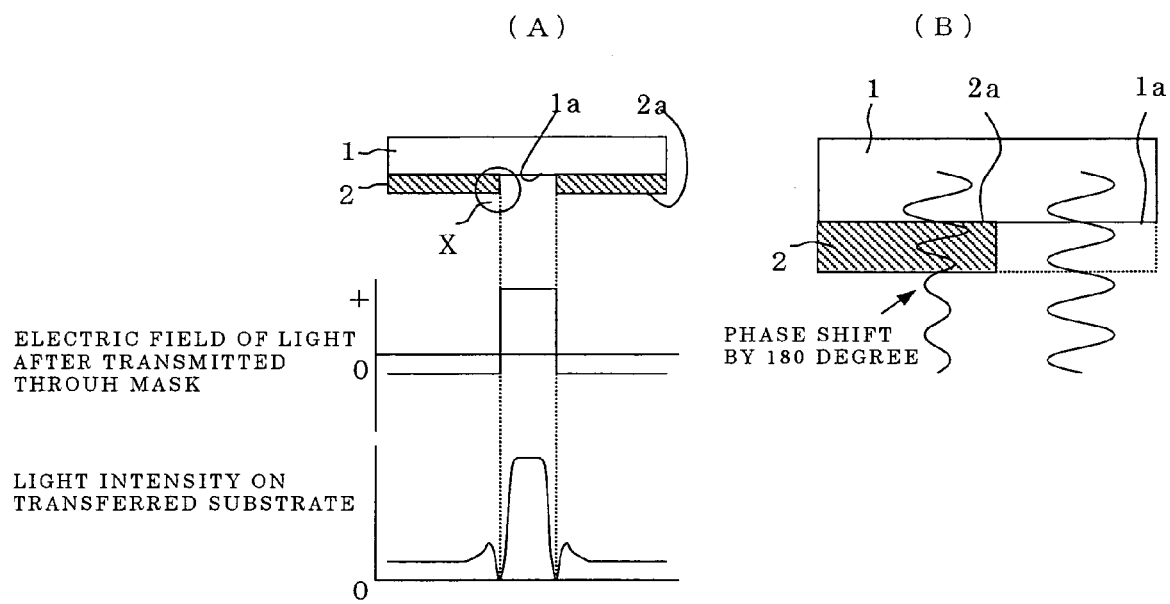
FIGS. 9(A)-(B) illustrate the principle of a halftone phase shift mask.

To be more precise, there may be employed the method wherein as shown in FIG. 8(A), after a phase shift film 2 is formed on a substrate 1 as described above, a resist film 7 is further formed, the resist film 7 is pattered by a lithography method as shown in FIG. 8(B), and after the phase shift film 2 is etched as shown in FIG. 8(C), the resist film 7 is stripped to produce a phase shift mask 6 as shown FIG. 8(D). In this process, application of the resist film, patterning (exposure and development), etching and stripping of a resist film may be carried out by known techniques.

Figure 10:
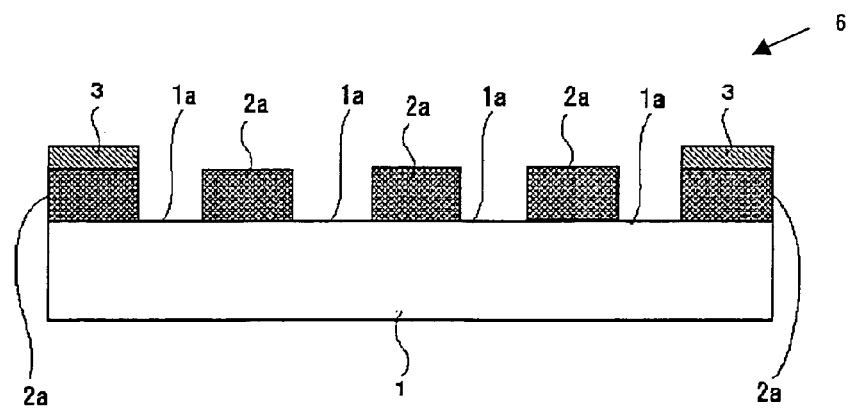
FIG. 10 shows another structure of a phase shift mask according to the first embodiment of the present invention.

In addition, in the case of forming a Cr base light shielding film and/or a Cr base antireflection film (Cr base film) on the phase shift film, after the region required for exposure in the light shielding film and/or the antireflection film is removed by etching to expose the surface of the phase shift film, the phase shift film is patterned as in the above, and thereby, the phase shift mask 6 in which the Cr base films 3 remain on the periphery of the substrate 1 as shown in FIG. 10 can be obtained. And, there may be also employed the method wherein a resist is applied on a Cr base film, a patterning is performed, the Cr base film and the phase shift film are pattered by etching, only a region required for exposure in the Cr base film is removed by selective etching to expose a phase shift pattern on the surface, and thereby, a phase shift mask can be obtained.

Next, the second embodiment of the present invention will be explained.

Hereinafter, the second embodiment of the present invention will be explained in detail in reference to drawings, but the present invention is not limited thereto.

Through assiduous studies for solving the above problems, inventors of the present invention found that in a phase shift mask blank comprising at least a multilayer phase shift film composed of two or more layers of phase shift films on a substrate, if the multilayer phase shift film is formed with a metal silicide compound, and a metal content in an outermost layer of the phase shift film in the multilayer phase shift film is 1/20-1/3 (molar ratio) of a metal content in a phase shift film which contains the most metal among the phase shift films in the multilayer phase shift film, a phase shift mask blank and a phase shift mask having satisfied optical characteristics, good chemical resistance, and few defects can be obtained. Accordingly, they accomplished the present invention.

Namely, when a metal content in an outermost layer of the phase shift film in the multilayer phase shift film is 1/3 (molar ratio) or less of a metal content of a phase shift film which contains the most metal among phase shift films in the multilayer phase shift film, the film having good chemical stability can be formed as the surface of the multilayer phase shift film, and thereby, the phase shift mask blank and the phase shift mask having good chemical resistance can be obtained.

Also, when a metal content in an outermost layer of the phase shift film in the multilayer phase shift film is 1/20 (molar ratio) or more of a metal content of a phase shift film which contains the most metal among phase shift films in the multilayer phase shift film, generation of defects due to particles and the like during the sputtering film formation can be suppressed, and thereby, the phase shift mask blank and the phase shift mask having few defects can be obtained.

Moreover, when the multilayer phase shift film comprises, in addition to the phase shift films as described above, a Cr base light shielding film, a Cr base antireflection film, or both of one or more Cr base light shielding films and one or more Cr base antireflection films are formed on the phase shift films to make a multiple layered film, by a synergetic effect, a further precise patterning can be performed and the phase shift mask blank and the phase shift mask blank can cope sufficiently with further miniaturization and high integration of semiconductor integrated circuits.

Hereinafter, the second embodiment of the present invention will be explained further in detail.

Figure 11:
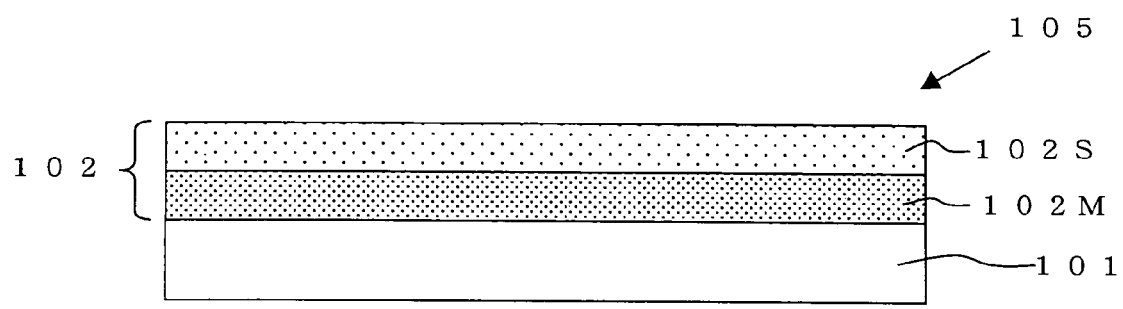
FIG. 11 shows a structure of a phase shift mask blank according to the second embodiment of the present invention.

As shown in FIG. 11, a phase shift mask blank 105 of the present invention is obtained by forming a multilayer phase shift film 102 composed of two or more phase shift films comprising a metal silicide compound on a substrate 101 made of quartz, $CaF_2$, or the like through which exposure light can transmit.

Figure 12:
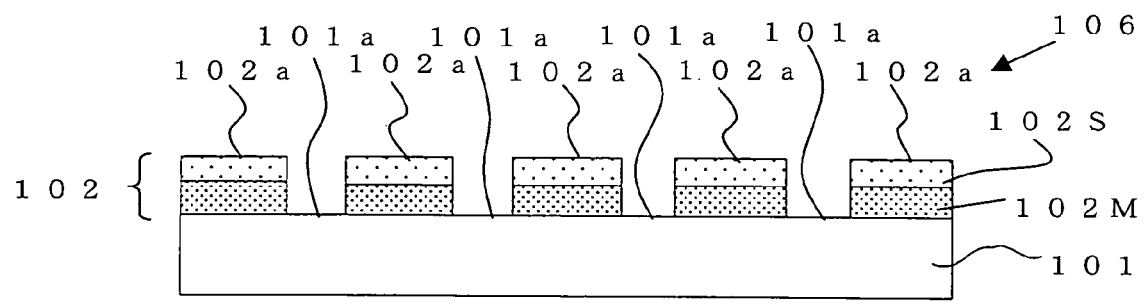
FIG. 12 shows a structure of a phase shift mask according to the second embodiment of the present invention.

And, as shown in FIG. 12, a phase shift mask 106 of the present invention is obtained by patterning the multilayer phase shift film 102 of the phase shift mask blank 105 as shown in FIG. 11 of the present invention, and the phase shift mask 106 is provided with patterned phase shifter portions 102a and substrate exposure portions 101a provided between the phase shifter portions 102a.

The multilayer phase shift film 102 is formed by a reactive sputtering method or the like with a sputtering gas containing at least oxygen and/or nitrogen, and the film has a transmittance of exposure light from several percents to several dozen percents (in particular, 3-40% is preferable), for example. And, when the phase shift mask blank 106 as shown in FIG. 12 is formed, its phase difference between the light transmitted through the exposed substrate area 101a and the light transmitted through the phase shifter portion 102a is set at 180±5 degrees. The multilayer phase shift film 102 comprises a metal silicide oxide, a metal silicide nitride, or a metal silicide oxide nitride, for example.

As shown in FIG. 11, in the phase shift mask blank 105 of the present invention, the multilayer phase shift film 102 is composed of an optical characteristic film 102M containing the most metal among the layers in the multilayer phase shift film 102 and a low metal containing film 102S which is the outermost layer of the phase shift film in the multilayer phase shift film 102. The optical characteristic film 102M has a metal content possible to satisfy desired optical characteristics. on the other hand, since the low metal containing film 102S which is the outermost layer has 1/20-1/3 (molar ratio) of the metal content of the optical characteristic film 102M, the low metal containing film 102S has good chemical stability and good chemical resistance.

The present invention focuses attention on a metal content in the film as one parameter to determine chemical resistance of a metal silicide compound film. Namely, inventors of the present invention found that the chemical resistance of a metal silicide compound film is improved as a metal content in the film is decreased, and in the case that a metal content of a single layer metal silicide compound film which is formed so as to satisfy optical characteristics is 1, when the metal content in a film to be formed is set at ⅓ or less, the effect of improvement of the chemical resistance clearly emerged.

However, the phase shift film having desired optical characteristics can not be obtained even if the above low metal containing film serving as a metal silicide compound film of a low metal content is used. And, the inventors of the present invention conceived that by combining an optical characteristic film serving as a metal silicide compound film which has a metal content possible to satisfy desired optical characteristics with a low metal containing film having good chemical resistance, a multilayer phase shift film having satisfied optical characteristics and good chemical resistance is formed.

At this point, the low metal containing film is formed as the outermost layer of the phase shift film in the multilayer phase shift film in order to increase chemical resistance. And, the thickness of the low metal containing film may be 10 Å or more, and preferably, 50-400 Å. Moreover, the above multilayer phase shift film is not limited to the film composed of two layers, and the film composed of three layers or more may be formed.

The present invention takes measures to meet requirement for the low defects in the multilayer phase shift film. When the multilayer phase shift film as described above is formed, it is a general method that each layer of phase shift film is formed by a sputtering method from the lowest layer while targets having different metal contents are used one by one. However, it has been found that as the number of the films is increased, an amount of defects in the films is increased. As the result of investigating this cause, it was found that discharge from a target becomes instable when starting and finishing the sputtering film formation in each layer, and therefore, scattering of particles and damages to the films occur.

And, in a film forming apparatus in which plural targets are set, components for film formation generated from a discharged target may be attached to the other undischarged targets. If this attached components are insulative, it causes generation of arc when discharge is started again. The inventors of the present invention also found that such generation of arc causes a fatal defect.

In order to solve these problems, the inventors of the present invention found that the following production method is effective.

Figure 13:
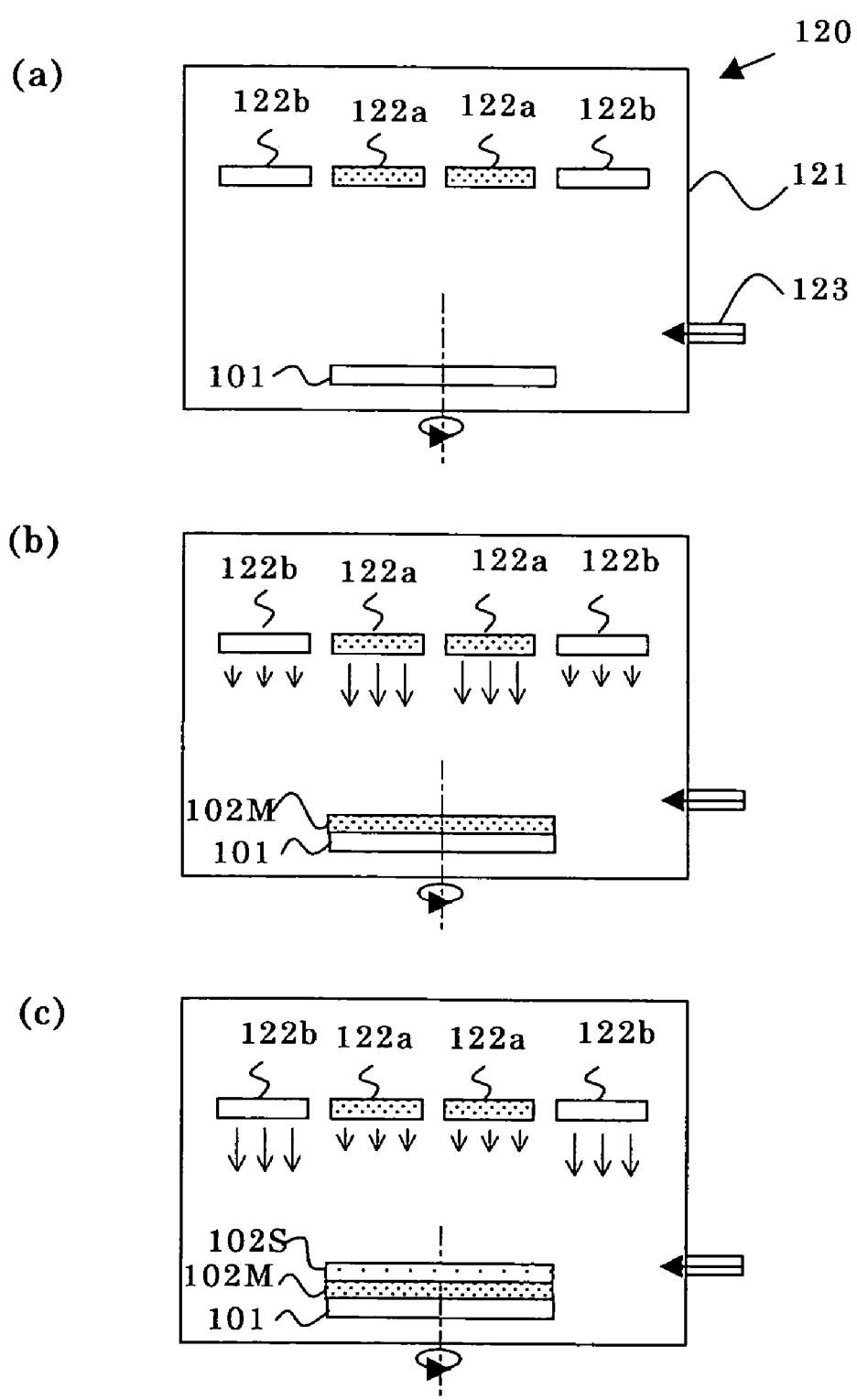
FIG. 13 includes drawings showing one example of a production method of a phase shift mask blank according to the second embodiment of the present invention.

FIG. 13 show one example of a production method of the phase shift mask blank of the present invention. First, plural metal silicide targets (targets for an optical characteristic film) 122a and plural silicon targets (targets for a low metal containing film) 122b are attached in a sputtering chamber 121 of a sputtering apparatus 120 (FIG. 13(a)). The plural targets 122a and 122b are simultaneously discharged to perform sputtering while a predetermined sputtering gas is introduced from a sputtering gas inlet 123, and film components scattered from each targets 122a and 122b are synthesized to form the film. At this point, it is desirable to rotate a substrate 101 so as to mix the components from each target uniformly. Generally, since the film formation rate is in proportion to discharge power applied to a target, desired film components can be obtained by adjusting the combination of discharge powers applied to each target.

For example, in the case of forming a phase shift mask blank 105 as shown in FIG. 11, when an optical characteristic film 102M is formed, by increasing discharge power applied to metal silicide targets 122a and decreasing discharge power applied to silicon targets 122b, the optical characteristic film 102M of which metal content is high is formed (FIG. 13(b)). On the other hand, in the case of forming a low metal containing film 102S, by decreasing electric power applied to metal silicide targets 122a and increasing electric power applied to silicon silicide targets 122b, the low metal containing film 102S of which metal content is low is formed (FIG. 13(c)).

By such a film formation method, the multilayer phase shift film is formed. In this case, a target used once for forming a layer in the multilayer phase shift film continuously discharged even when the other layers are formed. Thereby, discharge instability in starting and finishing of the sputtering film formation does not occur (FIGS. 13(b) and 13(c)). Since the target for the optical characteristic film to form a metal silicide compound film having satisfied optical characteristics has a high metal content, a continuous high power discharge causes a problem when a film having a low metal content such as the low metal containing film is formed. And, the inventors of the present invention investigated increase of defects in the film due to instable discharge when discharge power to each target is lowered. As the result, it was confirmed that the increase of defects in the film is not observed when the discharge power of 1/20 or more of a normal discharge power is applied to each target.

Namely, the low metal containing film is formed while the discharge power applied to the target used mainly for forming the phase shift film having the highest metal content in the multilayer phase shift film is lowered to 1/20 or more of a normal discharge power.

As aforementioned, generally, since the film formation rate is in proportion to a discharge power applied to a target, a metal content of the low metal containing film can be lowered to ⅟₂₀ of the metal content of the film having the highest metal content in the multilayer phase shift film.

At this point, in order to lower the metal content of the low metal containing film as much as possible, it is effective to combine a silicon target with a metal silicide target (a target for the optical characteristic film).

It is desirable to use a molybdenum silicide as the metal silicide target since a target which is dense and high purity is easily obtained. Similarly, it is desirable that the multilayer phase shift film comprises a film of which main component is a molybdenum silicide compound.

In the present invention, a direct current power source or a high frequency power source may be used in the sputtering method. Also, a magnetron sputtering method, a conventional method, or the like may be employed as the sputtering method.

The sputtering gas may contain an inert gas such as argon or xenon, nitrogen gas, oxygen gas, various nitrogen oxide gas, and carbon oxide gas, which are suitably added so that the phase shift film formed may have a desired composition.

Where it is desired to increase the transmittance of a phase shift film, it is recommended that the amounts of oxygen and nitrogen-containing gases in the sputtering gas be increased, or a molybdenum silicide having more oxygen and nitrogen previously added thereto be used as the sputtering target, so that more oxygen and nitrogen are taken into the film.

To be more precise, when a molybdenum silicide oxide nitride (MoSiON) film is formed, for example, it is preferable that a molybdenum silicide is used as a target and a reactive sputtering is performed with a sputtering gas containing an argon gas, a nitrogen gas, and an oxygen gas.

It is preferable that a molybdenum silicide oxide (MoSiO) film formed in the above process is composed of Mo: 0.2-25 atom %, Si: 10-42 atom %, and O: 30-60 atom %. It is preferable that the molybdenum silicide oxide nitride (MoSiON) film is composed of Mo: 0.2-25 atom %, Si: 10-57 atom %, O: 2-20 atom %, and N: 5-57 atom %.

Figure 14:
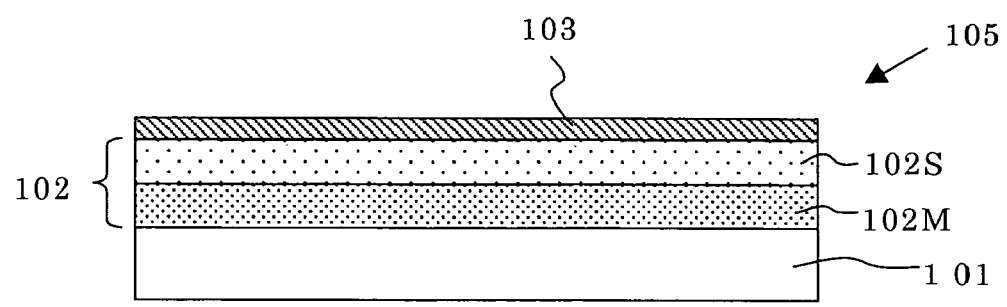
FIG. 14 shows a structure of a phase shift mask blank having a Cr base light shielding film according to the second embodiment of the present invention.
Figure 15:
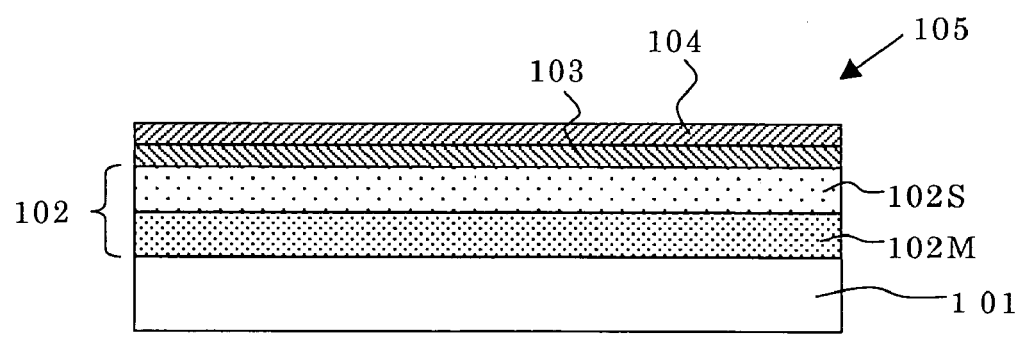
FIG. 15 shows a structure of a phase shift mask blank having a Cr base light shielding film and a Cr base antireflection film according to the second embodiment of the present invention.
Figure 16:
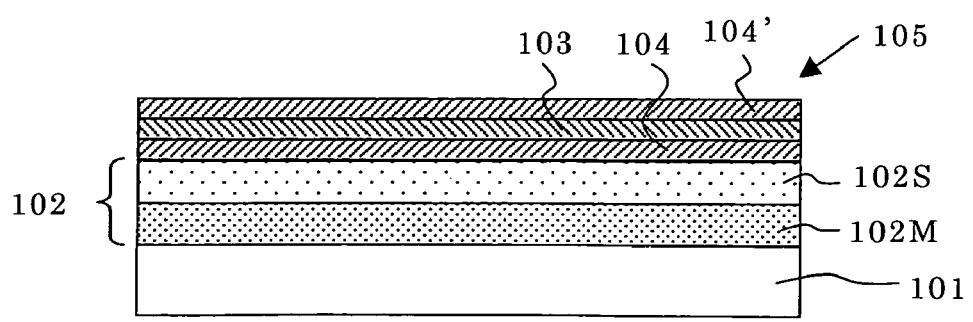
FIG. 16 shows another structure of a phase shift mask blank according to the second embodiment of the present invention.

And, as shown in FIG. 14, a Cr base light shielding film 103 may be formed on a multilayer phase shift film 102, or, as shown in FIG. 15, a Cr base antireflection film 104 for lowering the reflection of light from a Cr base light shielding film 103 may be formed on the Cr base light shielding film 103. Moreover, as shown in FIG. 16, a multilayer phase shift film 102, a first Cr base antireflection film 104, a Cr base light shielding film 103, and a second Cr base antireflection film 104' may be formed on a substrate 101 in order.

Where it is preferable to use a chrome oxide carbide (CrOC), a chrome oxide nitride carbide (CrONC) or a laminate thereof as the Cr base light shielding film or the Cr base antireflection film.

Such a Cr base light shielding film or a Cr base antireflection film can be formed with a target of chromium itself or a target wherein oxygen, nitrogen, or carbon, or combination thereof is added to chromium and by a reactive sputtering method with a sputtering gas wherein a carbon dioxide gas is added as a carbon source to an inert gas such as argon or krypton.

To be more precise, when the CrONC film is formed, there can be used one or more gases selected from a gas containing carbon such as $CH_4$, $CO_2$, or CO, a gas containing nitrogen such as NO, $NO_2$, or $N_2$, a gas containing oxygen such as $CO_2$, NO or $O_2$, and a gas wherein these gases are mixed with an inert gas such as Ar, Ne, or Kr as a sputtering gas. In particular, it is preferable to use a carbon dioxide gas as a carbon source and an oxygen source in terms of uniformity in the film and controllability in the production of the film. As to the gas introduction method, various sputtering gases may be separately introduced into a chamber, or gas wherein several gases or all of gases are mixed and may be introduced thereinto.

In addition, it is preferable that a CrOC film is composed of Cr: 20-95 atom %, in particular, 30-85 atom %; C: 1-30 atom %, in particular, 5-20 atom %; and O: 1-60 atom %, in particular, 5-50 atom %. Also, it is preferable that the CrONC film is composed of Cr: 20-95 atom %, in particular, 30-80 atom %; C: 1-20 atom %, in particular, 2-15 atom %; O: 1-60 atom %, in particular, 5-50 atom %; and N: 1-30 atom %, in particular, 3-20 atom %.

The phase shift mask according to the second embodiment of the present invention is obtained by forming a pattern on the phase shift film of the mask blank obtained as described above.

Figure 17:
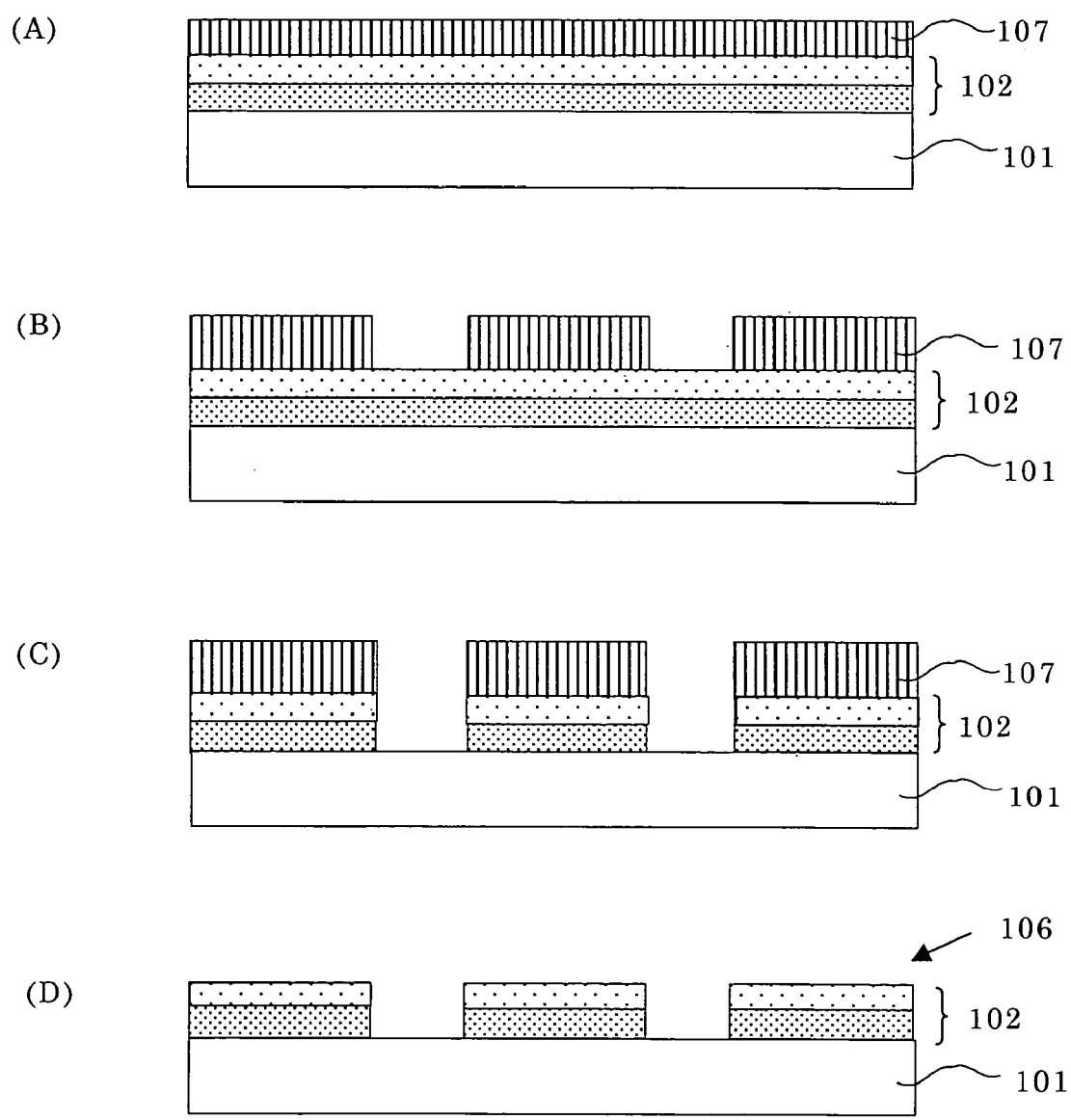
FIG. 17 includes explanatory views showing a production method of a phase shift mask.

To be more precise, in order to produce a phase shift mask 106 as shown in FIG. 12, there can be employed the method wherein as shown in FIG. 17(A), after a multilayer phase shift film 102 is formed on a substrate 101 as described above, a resist film 107 is formed, the resist film 107 is patterned by a lithography method as shown in FIG. 17(B), and after the multilayer phase shift film 102 is etched as shown in FIG. 17(C), the resist film 107 is removed as shown in FIG. 17(D). In this process, application of the resist film, patterning (exposure and development), etching, and removal of the resist film may be carried out by known techniques.

Figure 18:
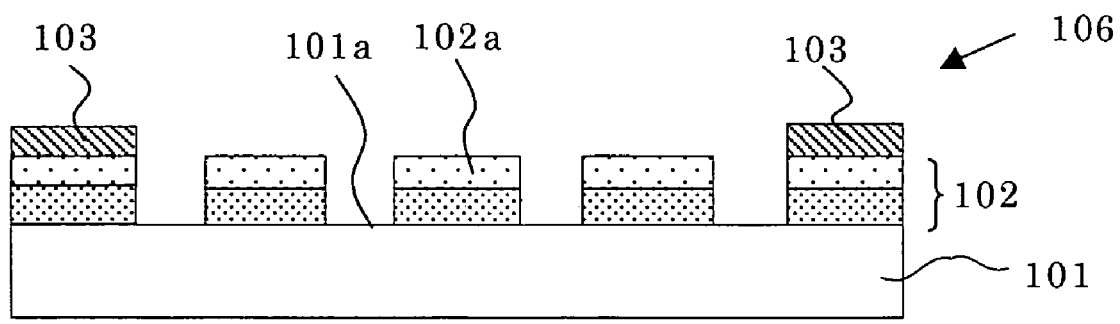
FIG. 18 shows another structure of a phase shift mask according to the second embodiment of the present invention.

In addition, in the case of forming a Cr base light shielding film and/or a Cr base antireflection film (Cr base film) on the multilayer phase shift film, after the region required for exposure in the light shielding film and/or the antireflection film is removed by etching to expose the surface of the multilayer phase shift film, the multilayer phase shift film is patterned as in the above, and thereby, the phase shift mask 106 in which the Cr base films 103 remain on the periphery of the substrate as shown in FIG. 18 can be obtained. Also, a resist is applied on a Cr base film, a patterning is performed thereto, the Cr base film and a phase shift film are pattered by etching, and only a region required for exposure in the Cr base film is removed by selective etching so that a phase shift pattern on the surface of the substrate can emerge. Thereby, a phase shift mask can be obtained.

Next, the third embodiment of the present invention will be explained.

As described above, in the case of forming phase shift films are formed on a transparent substrate, it is a general method that each layer is formed by a sputtering method with various targets having different metal contents. However, it has been found that as the number of layers of phase shift films is increased, the amount of defects in the phase shift films is increased.

As the result of investigation of this cause, the inventors of the present invention found that discharge from a target becomes instable at starting and finishing the sputtering film formation in each layer, and therefore, scattering of particles and damages to the films occur.

Figure 21:
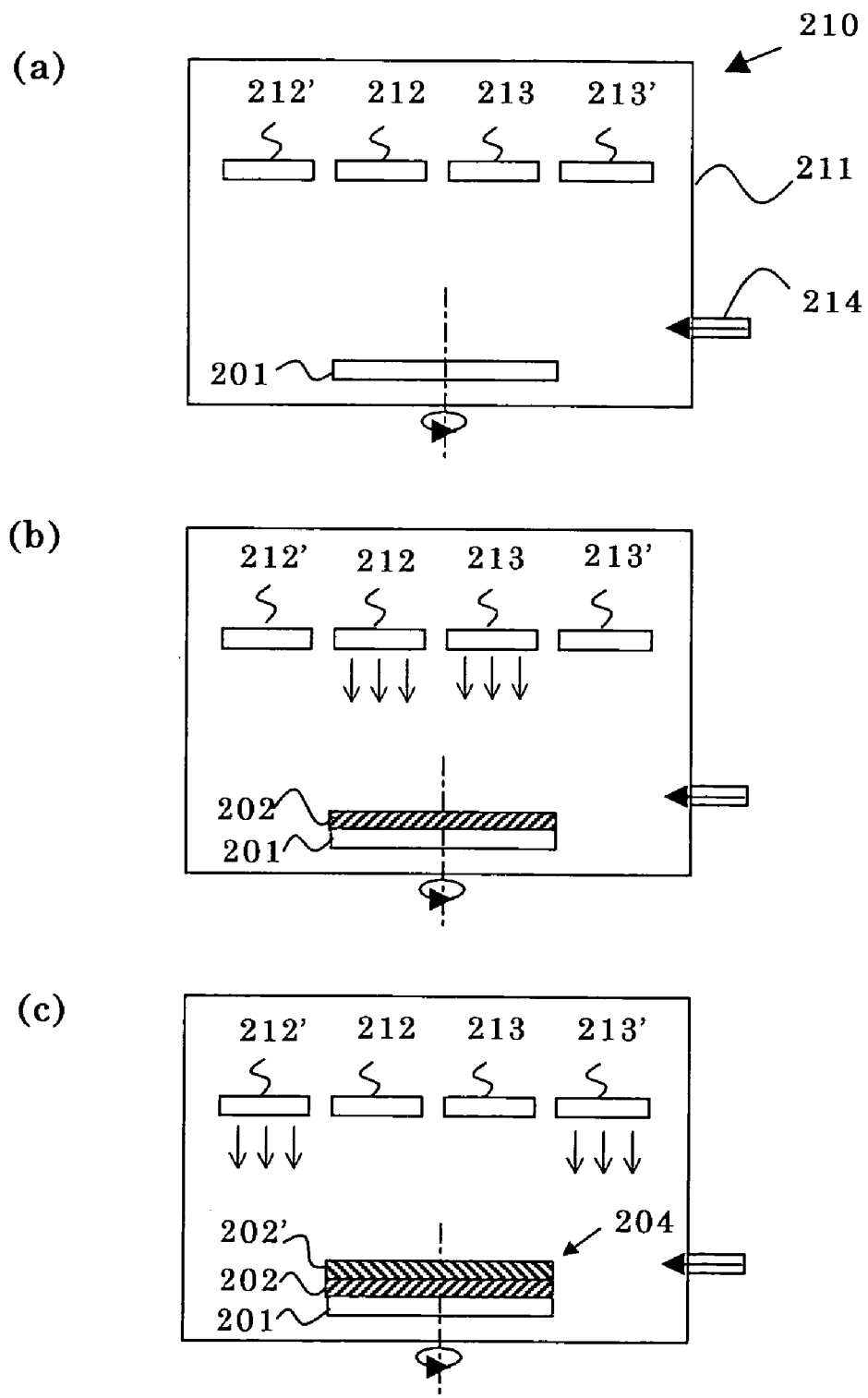
FIG. 21 is a flowchart containing steps of (a)-(c) showing a conventional production method of a phase shift mask blank.

Namely, in a conventional method, when phase shift films 202 and 202' are formed on a transparent substrate 201 with a sputtering apparatus 210 as shown in FIG. 21, plural metal silicide targets 212 and 212' having various metal contents for forming each phase shift films 202 and 202' and plural silicon targets 213 and 213' are attached in a single film forming chamber 211, and a sputtering gas is introduced from a sputtering gas inlet 214 into the chamber (FIG. 21(a)).

Among the prepared targets 212, 212', 213, and 213', only the targets 212 and 213 for forming the phase shift film 202 are discharged to form the film (FIG. 21(b)). After the phase shift film 202 is formed, the discharge of the targets 212 and 213 used for forming the phase shift film 202 is once stopped, and the targets 212' and 213' for subsequently forming a phase shift film 202' are discharged to form the phase shift film 202', and thereby, a phase shift mask blank 204 is produced (FIG. 21(c)).

However, it was found that if starting and finishing of the discharge of the targets are repeated as described above, the discharge of the targets becomes instable, and therefore, defects are generated in the phase shift films.

And, in the sputtering apparatus in which plural targets are set, components for the film formation generated from a discharged target may be attached to the other undischarged targets. If this attached components are insulative, it causes generation of arc when the discharge is started again. The inventors of the present invention also found that such generation of arc causes a fatal defect.

Accordingly, the inventors of the present invention conceived that in the case of forming any layers of phase shift films, a target used for forming a layer of phase shift films once is continuously discharged even when the other layers of phase shift films are formed. Thereby, discharge instability at starting and finishing of the sputtering film formation does not occur and the attachment of the components for the film formation generated from a discharged target to an undischarged target can also be prevented.

The inventors of the present invention investigated increase of defects in the films due to an instable discharge when discharge powers to each target are lowered. As the result, it was confirmed that the increase of defects in the film is not observed when the discharge powers of 1/20 (5%) of a normal discharge power are applied to targets.

Therefore, when any layer of phase shift films is formed with a target for forming the layer of the phase shift film, the target is discharged at a certain power required to form the film, and when the other layers of phase shift films are formed, the target is continuously discharged while the discharge power is lowered. Thereby, each film can have a desired composition.

When the phase shift films are formed by continuously applying discharge power to each target as described above, each layer of the phase shift films contains 1-10% of compositions of adjacent layers. As to a phase shift mask blank comprising the above films, since each target is discharged without a shutdown, i.e., stably discharged when each layer of the phase shift films are formed, defects in the phase shift films can be decreased. Moreover, although each layer contains 1-10% of the compositions of adjacent layers, if the layer contains this degree of the compositions, there is almost no adverse influence on optical characteristics, etc. of each layer.

Hereinafter, the third embodiment of the present invention will be explained in detail in reference to drawings, but the present invention is not limited thereto.

In the present invention, the sputtering apparatus may employ a direct-current power supply or a high-frequency power supply, and may employ a magnetron sputtering system, a conventional sputtering system, or the like.

The sputtering gas may contain an inert gas such as argon or xenon, to which one or more gases selected from nitrogen gas, oxygen gas, various nitrogen oxide gases, and various carbon oxide gases are suitably added so that the phase shift film formed may have a desired composition.

Where it is desired to increase the transmittance of a phase shift film to be formed, it is recommended that the amounts of oxygen and nitrogen-containing gases in the sputtering gas be increased, or a molybdenum silicide having more oxygen and nitrogen previously added thereto be used as the sputtering target, so that more oxygen and nitrogen are taken into the film.

To be more precise, when a phase shift film comprising Mo, Si, O, and N as constituent elements is formed, it is preferable that a molybdenum silicide is used as a target and a reactive sputtering is performed with a sputtering gas containing an argon gas, an nitrogen gas, and oxygen gas, for example.

It is preferable that the MoSiON film formed in the above process is composed of Mo: 0.2-25 atom %, Si: 10-57 atom %, O: 2-20 atom %, and N: 5-57 atom %, for example.

Figure 20:
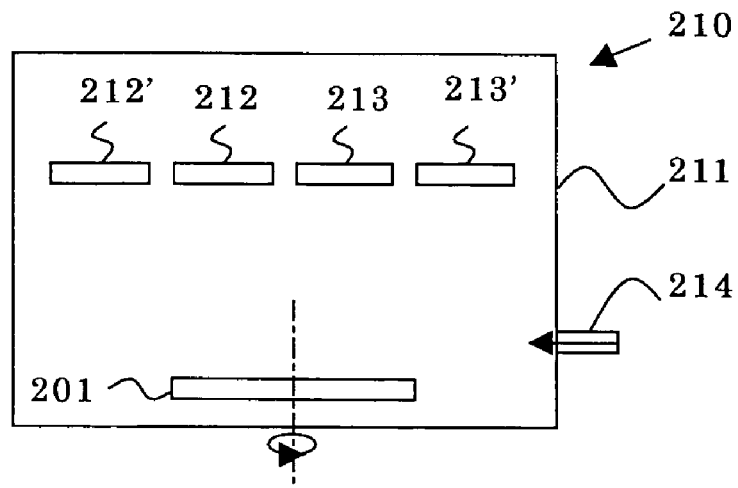
FIG. 20 is a flowchart containing steps of (a)-(c) showing a production method of a phase shift mask blank according to the third embodiment of the present invention.
Figure 20:
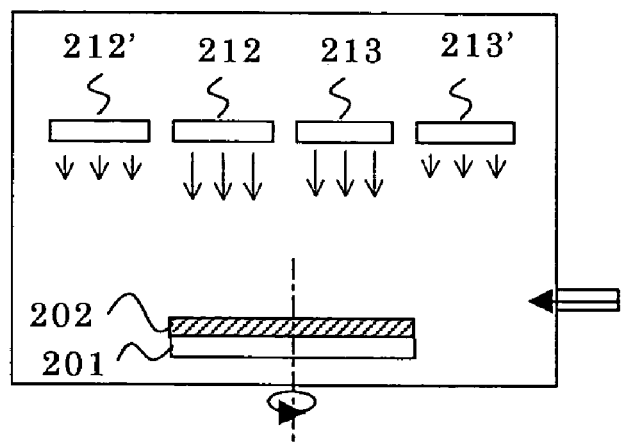
Figure 20:
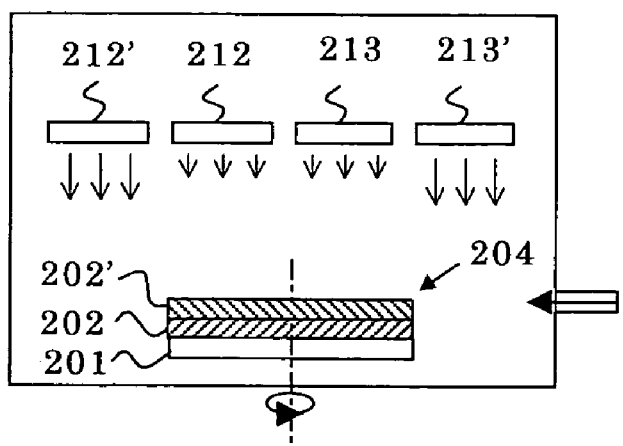

And, the phase shift mask blank of the present invention is formed as follows. First, as shown in FIG. 20, a transparent substrate 201 comprising quartz or the like is disposed in a film forming chamber 211 of a sputtering apparatus 210, plural metal silicide targets 212 and 212'having various metal contents and plural silicon targets 213 and 213' for forming each layer of phase shift films 202 and 202' are attached in a film forming chamber 211, and the sputtering gas as aforementioned is introduced from a sputtering gas inlet 214 thereinto (FIG. 20(a)).

Among the prepared targets 212, 212', 213, and 213', only the targets 212 and 213 mainly used for forming the phase shift film 202 are discharged to form the phase shift film 202. At this point, the targets 212' and 213', which are not mainly used for forming the phase shift film 202, are also discharged at a minimum power possible to stably discharge the targets (FIG. 20(b)).

After the phase shift film 202 is formed, the discharge power applied to the targets 212' and 213' mainly used for subsequently forming a phase shift film 202' is increased to a predetermined power required to form the phase shift film 202', and thereby, the phase shift film 202' is formed. At this point, the targets 212 and 213, which are mainly used for forming the phase shift film 202, are also discharged at a minimum power possible to stably discharge the targets. As described above, the phase shift films 202 and 202' are formed on the transparent substrate 201 to produce a phase shift mask blank 204 (FIG. 20(c)).

As described above, since each target is continuously discharged during forming the phase shift films, the discharge becomes stable, and generation of defects or particles in the phase shift films can be prevented. And, the attachment of the components for the film formation generated from a discharged target to an undischarged target can be prevented and generation of arc can also be prevented.

In addition, the phase shift mask blank of the present invention is not limited to a phase shift mask blank wherein only plural phase shift films are formed on the transparent substrate. For example, a Cr base light shielding film may be formed on the phase shift film produced by the method of the present invention. Moreover, a Cr base antireflection film for lowering the reflection of light from the Cr base light shielding film may be further formed on the Cr base light shielding film. The type of the substrate is not limited, in particular.

The phase shift mask according to the third embodiment of the present invention can be produced by a lithography method by which a pattern is formed on the phase shift films in the phase shift mask blank obtained as described above.

Figure 24:
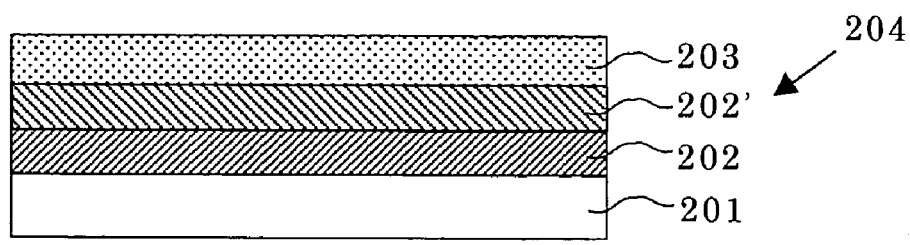
FIG. 24 is a flowchart containing steps of (a)-(d) showing a production method of a phase shift mask according to the third embodiment of the present invention.
Figure 24:
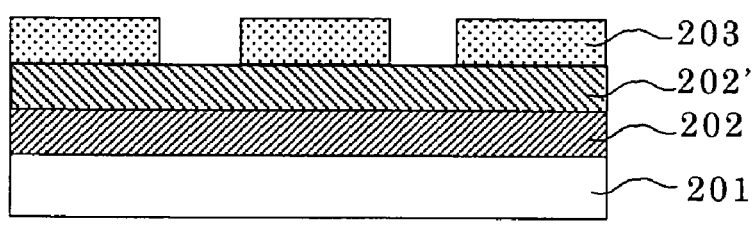
Figure 24:
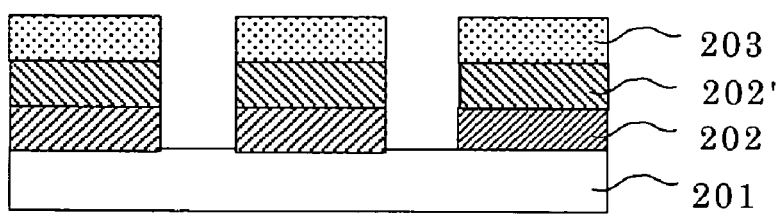
Figure 24:
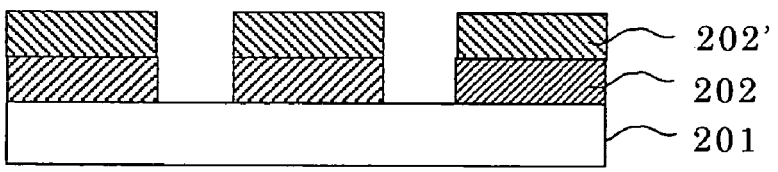

To be more precise, when the phase shift mask is formed, there may be employed the method wherein as shown in FIG. 24(a), after the shift mask blank 204 is produced by forming the phase shift films 202 and 202' on the transparent substrate 201, a resist film 203 is formed on the phase shift film 202', the resist film 203 is pattered by exposure and development as shown in FIG. 24(b), and after the phase shift films 202 and 202' are etched as shown in FIG. 24(c), the resist film 203 is removed as shown in FIG. 24(d) to produce a phase shift mask 205. In this process, application of the resist film, patterning (exposure and development), etching and removal of resist film may be carried out by known techniques.

EXAMPLES

Hereinafter, the present invention will be explained concretely with reference to Examples and Comparative Examples. However, the present invention is not limited thereto.

Example 1

A sputtering apparatus having a cathode structure in which plural (five) targets can be disposed and having a rotation mechanism for rotating a substrate was used. Three molybdenum silicide (MoSi 3.66) targets and two silicon targets were used. Ar, $N_2$, and $N_2O$ were used as a sputtering gas and introduced into a chamber at flow rates of 5, 30, and 0.6 sccm, respectively. A phase shift film comprising a molybdenum silicide oxide nitride was formed on a square-shaped quartz substrate with sides of 152 mm while discharge powers for each target were adjusted as shown in Table 1 and the substrate was rotated.

TABLE 1

| No. | 1 | 2 | 3 | 4 | 5 |
|---|---|---|---|---|---|
| Composition of Target | MoSi 3.66 | MoSi 3.66 | MoSi 3.66 | Si | Si |
| Discharge Power | 90 W | 85 W | 60 W | 200 W | 200 W |

After the phase shift film was formed, its phase shift degree and transmittance were measured within the range of 142 mm×142 mm except the periphery of the phase shift film at the wavelength of 193 nm. The distribution of the phase shift degree of the phase shift film was 179.77±1.24 degrees and the distribution of the transmittance of the film was 6.00±0.02%. Namely, the distribution of the phase shift degree of the phase shift film was within ±1.5 degrees and the distribution of the transmittance of the film was within ±0.1%. And its film thickness was 695 Å.

In this case, the phase difference and transmittance were measured with MPM-193 made by Lasertec Corporation.

The compositions of the phase shift film were inspected by XPS (X-Ray Photoelectron Spectroscopy), and the results were as follows.

TABLE 2

| Mo | Si | O | N | C |
|---|---|---|---|---|
| 7% | 42% | 6% | 45% | 0% |

Compared with the phase difference and the transmittance measured as above, the phase difference and the transmittance of the phase shift film after cleaned by an ammonia/hydrogen peroxide aqueous cleaning solution were changed by −2.1 degrees and +0.2%, respectively. As described above, it is found that the characteristics of the phase shift film are barely changed and the phase shift film has good chemical resistance even after the cleaning.

Example 2

A sputtering apparatus having a cathode structure in which plural (five) targets can be disposed and having a rotation mechanism for rotating a substrate was used. Two molybdenum silicide (MoSi 3.66) targets and three silicon targets were used. Ar, $N_2$, and $N_2O$ were used as a sputtering gas and introduced into a chamber at flow rates of 5, 30, and 0.4 sccm, respectively. A phase shift film comprising a molybdenum silicide oxide nitride was formed on a square-shaped quartz substrate with sides of 152 mm while discharge powers for each target were adjusted as shown in Table 3 and the substrate was rotated.

TABLE 3

| No. | 1 | 2 | 3 | 4 | 5 |
|---|---|---|---|---|---|
| Composition of Target | MoSi 3.66 | MoSi 3.66 | Si | Si | Si |
| Discharge Power | 35 W | 38 W | 200 W | 200 W | 250 W |

After the phase shift film was formed, its phase shift degree and transmittance were measured within the range of 142 mm×142 mm except the periphery of the phase shift film at the wavelength of 193 nm. The distribution of the phase shift degree of the phase shift film was 179.50±0.84 degrees and the distribution of the transmittance of the film was 10.10±0.06%. Namely, The distribution of the phase shift degree of the phase shift film was within ±1.5 degrees and the distribution of the transmittance of the film was within ±0.1%. And its film thickness was 670 Å.

The phase difference and transmittance were measured with MPM-193 made by Lasertec Corporation.

The compositions of the phase shift film were inspected by XPS and the results were as follows.

TABLE 4

| Mo | Si | O | N | C |
|---|---|---|---|---|
| 5% | 44% | 6% | 45% | 0% |

Comparing Example 1 with Example 2, it is found that by changing the ratio of the discharge powers to the metal silicide (molybdenum silicide) targets and the silicon targets, the transmittance of the phase shift film can be changed by changing the compositions of the film changed without changing the compositions of the targets.

Comparative Example 1

A sputtering apparatus having a cathode structure in which plural (three) targets can be disposed and having a rotation mechanism for rotating a substrate was used. Three molybdenum silicide (MoSi 3.66) targets were used. Ar, $N_2$, and $N_2O$ were used as a sputtering gas and introduced into a chamber at flow rates of 4, 30, and 5 sccm, respectively. A phase shift film comprising a molybdenum silicide oxide nitride was formed on a square-shaped quartz substrate with sides of 152 mm while discharge powers for each target were adjusted. as shown in Table 5 and the substrate was rotated.

TABLE 5

| No. | 1 | 2 | 3 |
|---|---|---|---|
| Composition of Target | MoSi 3.66 | MoSi 3.66 | MoSi 3.66 |
| Discharge Power | 230 W | 70 W | 60 W |

After the phase shift film was formed, its phase shift degree and transmittance were measured within the range of 142 mm×142 mm except the periphery of the phase shift film at the wavelength of 193 nm. The distribution of the phase shift degree of the phase shift film was 180 degrees and the distribution of the transmittance of the film was 5.5%. And its film thickness was 1400 Å.

The compositions of the phase shift film were inspected by XPS and the results were as follows.

TABLE 6

| Mo | Si | O | N | C |
|---|---|---|---|---|
| 14% | 32% | 38% | 16% | 0% |

Compared with the phase difference and the transmittance measured as above, the phase difference and the transmittance of the phase shift film after cleaned by an ammonia/hydrogen peroxide aqueous cleaning solution were changed by −5.0 degrees and +0.8%, respectively. As described above, it is found that the characteristics of the phase shift film vary significantly and the chemical resistance of the film was deteriorated after the cleaning.

Comparing Example 1 with Comparative Example 1, in the Comparative Example 1 that the phase shift film was formed by using only metal silicide (molybdenum silicide) targets to increase the oxygen content therein, the phase shift film becomes thicker when the phase difference is 180 degrees. This means that its refractive index is small. However, it is preferable that the film thickness is thinner.

And comparing each cleaning chemical resistance, the deterioration by the chemical solution is remarkable in the sample of Comparative Example 1 of which oxygen content was increased. This means that the sample of the Example 1 of the present invention of which silicon content was increased to the metal content has good chemical resistance.

Example 3

Figure 19:
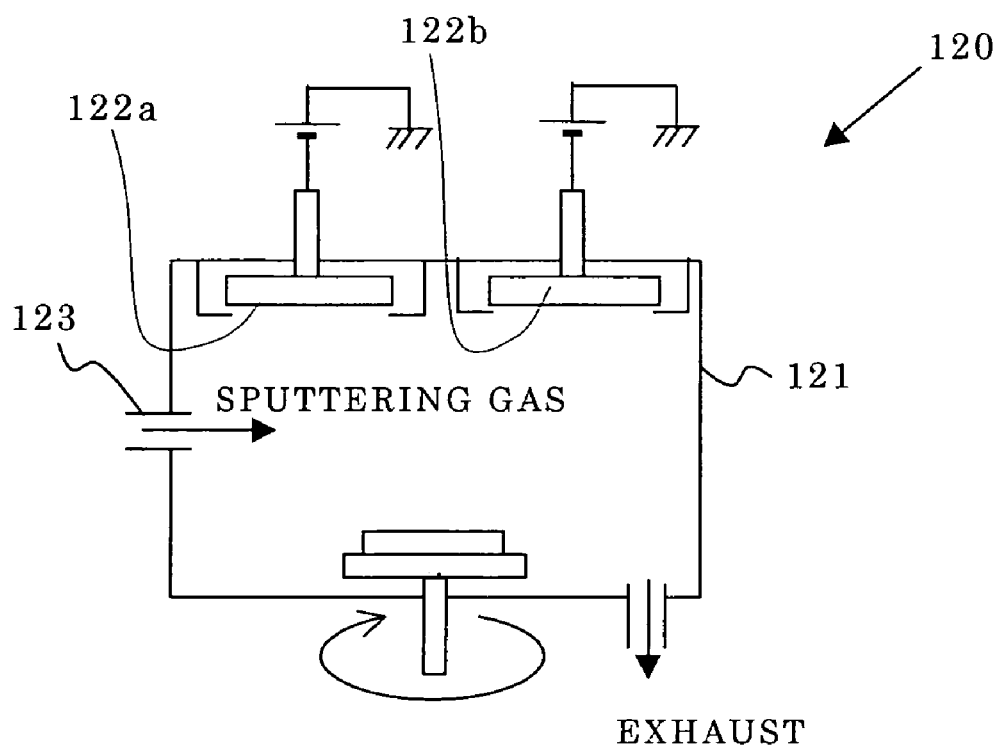
FIG. 19 is a schematic view showing a direct current sputtering apparatus used in Examples 3-7 and Comparative Examples 2-5.

As shown in FIG. 19, a direct current sputtering apparatus 120 in which two targets were disposed was used for forming the multilayer phase shift film. $MoSi_2$ was used as a target 122a for an optical characteristic film and a silicon target was used as the other target 122b.

First, the first layer of the phase shift film having a thickness of 500 Å was formed on the quartz substrate by sputtering by discharging the $MoSi_2$ target 122a at 1000 W and discharging the Si target 122b at 1000 W while a quartz substrate was rotated at 30 rpm. In that case, a mixed gas of Ar=20 $cm^3$/min, $N_2$=100 $cm^3$/min, and $O_2$=5 $cm^3$/min was introduced as a sputtering gas. The gas pressure in the sputtering was adjusted at 0.2 Pa.

Subsequently, the discharge powers to the $MoSi_2$ target 122a and the Si target 122b were changed into 26 W and 1000 W, respectively without a shutdown of the sputtering discharge, and the second layer of the phase shift film having a thickness of 100 Å was formed. In that case, the other film formation conditions were the same as in the formation of the first layer of the film.

In addition, the Mo contents of the first layer and the second layer of the phase shift films were calculated from the discharge powers in the sputtering. The ratio of the Mo contents was calculated from the following formula. As a result, the ratio was 0.051.

The ratio of the Mo contents=Mo concentration in the second layer film/Mo concentration in the first layer film.

The above film formation was performed on five substrates in a row, and the following items were evaluated.

Increasing Amount of Defects:

Increasing amount of defects before and after the film formation was evaluated. Increasing amount of defects having a size of 0.2 μm or more was 5.

Chemical Resistance:

The change of the transmittance before and after each film was immersed in a prepared solution (23° C.) of ammonia water:hydrogen peroxide solution:water=1:1:10 for one hour was measured. If the film has good chemical resistance, it seems that the change of the transmittance before and after immersion in the chemical solution is small. In addition, the wavelength for the measurement was 193 nm. The rate of change of the transmittance before and after immersion in the chemical solution was 0.012.

Example 4

As shown in FIG. 19, a direct current sputtering apparatus 120 in which two targets were disposed was used for forming the multilayer phase shift film. A $MoSi_2$ target was used as a target 122a for an optical characteristic film and a Si target was used as the other target 122b.

First, the first layer film having a thickness of 500 Å was formed on the quartz substrate by sputtering by discharging the $MoSi_2$ target 122a at 1000 W and discharging the Si target 122b at 1000 W while a quartz substrate was rotated at 30 rpm. In that case, a mixed gas of Ar=20 $cm^3$/min, $N_2$=100 $cm^3$/min, and $O_2$=5 $cm^3$/min was introduced as a sputtering gas. The gas pressure in the sputtering was adjusted at 0.2 Pa.

Subsequently, the discharge powers to the $MoSi_2$ target 122a and the Si target 122b were changed into 50 W and 1000 W, respectively without a shutdown of the sputtering discharge, and the second layer film having a thickness of 100 Å was formed. In that case, the other film formation conditions were the same as in the formation of the first layer film.

In addition, the Mo contents in the first layer film and the second layer film were calculated from the discharge powers in the sputtering. The ratio of the Mo contents was calculated from the following formula. As a result, the ratio was 0.095.

The ratio of the Mo contents=Mo concentration in the second layer film/Mo concentration in the first layer film.

The above film formation was performed on five substrates in a row, and the following items were evaluated.

Increasing Amount of Defects:

Increasing amount of defects before and after the film formation were evaluated. Increasing amount of defects having a size of 0.2 μm or more was 2.

Chemical Resistance:

The change of the transmittance before and after each film was immersed in a prepared solution (23° C.) of ammonia water:hydrogen peroxide solution:water=1:1:10 for one hour was measured. If the film has good chemical resistance, it seems that the change of the transmittance before and after immersion in the chemical solution is small. In addition, the wavelength for the measurement was 193 nm. The rate of change of the transmittance before and after immersion in the chemical solution was 0.018.

Example 5

As shown in FIG. 19, a direct current sputtering apparatus 120 in which two targets were disposed was used for forming the multilayer phase shift film. A $MoSi_2$ target was used as a target 122a for an optical characteristic film and a Si target was used as the other target 122b.

First, a sputtering film formation was performed by discharging the $MoSi_2$ target 122a at 1000 W and discharging the Si target 122b at 1000 W while a quartz substrate was rotated at 30 rpm, and the first layer film having a thickness of 500 Å was formed on the quartz substrate. In that case, a mixed gas of Ar=20 $cm^3$/min, $N_2$=100 $cm^3$/min, and $O_2$=5 $cm^3$/min used as a sputtering gas was introduced. The gas pressure in the sputtering was adjusted at 0.2 Pa.

Subsequently, the discharge powers to the $MoSi_2$ target 122a and the Si target 122b were changed into 100 W and 1000 W, respectively without a shutdown of the sputtering discharge, and the second layer film having a thickness of 100 Å was formed. In that case, the other film formation conditions were the same as in the formation of the first layer film.

In addition, the Mo contents in the first layer film and the second layer film were calculated from the discharge powers in the sputtering. The ratio of the Mo contents was calculated from the following formula. As a result, the ratio was 0.182.

The ratio of the Mo contents=Mo concentration in the second layer film/Mo concentration in the first layer film.

The above film formation was performed on five substrates in a row, and the following items were evaluated.

Increasing Amount of Defects:

Increasing amount of defects before and after the film formation were evaluated. Increasing amount of defects having a size of 0.2 µm or more was 4.

Chemical Resistance:

The change of the transmittance before and after each film was immersed in a prepared solution (23° C.) of ammonia water:hydrogen peroxide solution:water=1:1:10 for one hour was measured. If the film has good chemical resistance, it seems that the change of the transmittance before and after immersion in the chemical solution is small. In addition, the wavelength for the measurement was 193 nm. The rate of change of the transmittance before and after immersion in the chemical solution was 0.022.

Example 6

As shown in FIG. 19, a direct current sputtering apparatus 120 in which two targets were disposed was used for forming the multilayer phase shift film. A $MoSi_2$ target was used as a target 122a for an optical characteristic film and a Si target was used as the other target 122b.

First, the first layer film having a thickness of 500 Å was formed on the quartz substrate by sputtering by discharging the $MoSi_2$ target 122a at 1000 W and discharging the Si target 122b at 1000 W while a quartz substrate was rotated at 30 rpm. In that case, a mixed gas of Ar=20 $cm^3$/min, $N_2$=100 $cm^3$/min, and $O_2$=5 $cm^3$/min was introduced as a sputtering gas. The gas pressure in the sputtering was adjusted at 0.2 Pa.

Subsequently, the discharge powers to the $MoSi_2$ target 122a and the Si target 122b were changed into 200 W and 1000 W, respectively without a shutdown of the sputtering discharge, and the second layer film having a thickness of 100 Å was formed. In that case, the other film formation conditions were the same as in the formation of the first layer film.

In addition, the Mo contents in the first layer film and the second layer film were calculated from the discharge powers in the sputtering. The ratio of the Mo contents was calculated from the following formula. As a result, the ratio was 0.333.

The ratio of the Mo contents=Mo concentration in the second layer film/Mo concentration in the first layer film.

The above film formation was performed on five substrates in a row, and the following items were evaluated.

Increasing Amount of Defects:

Increasing amount of defects before and after the film formation were evaluated. Increasing amount of defects having a size of 0.2 µm or more was 5.

Chemical Resistance:

The change of the transmittance before and after each film was immersed in a prepared solution (23° C.) of ammonia water:hydrogen peroxide solution:water=1:1:10 for one hour was measured. If the film has good chemical resistance, it seems that the change of the transmittance before and after immersion in the chemical solution is small. In addition, the wavelength for the measurement was 193 nm. The rate of change of the transmittance before and after immersion in the chemical solution was 0.025.

Comparative Example 2

As shown in FIG. 19, a direct current sputtering apparatus 120 in which two targets were disposed was used for forming the multilayer phase shift film. A $MoSi_2$ target was used as a target 122a for an optical characteristic film and a Si target was used as the other target 122b.

First, the first layer film having a thickness of 500 Å was formed on the quartz substrate by sputtering by discharging the $MoSi_2$ target 122a at 1000 W and discharging the Si target 122b at 1000 W while a quartz substrate was rotated at 30 rpm. In that case, a mixed gas of Ar=20 $cm^3$/min, $N_2$=100 $cm^3$/min, and $O_2$=5 $cm^3$/min used as a sputtering gas was introduced. The gas pressure in the sputtering was adjusted at 0.2 Pa.

Subsequently, the discharge powers to the $MoSi_2$ target 122a and the Si target 122b were changed into 400 W and 1000 W, respectively without a shutdown of the sputtering discharge, and the second layer film having a thickness of 100 Å was formed. In that case, the other film formation conditions were the same as in the formation of the first layer film.

In addition, the Mo contents in the first layer film and the second layer film were calculated from the discharge powers in the sputtering. The ratio of the Mo contents was calculated from the following formula. As a result, the ratio was 0.571.

The ratio of the Mo contents=Mo concentration in the second layer film/Mo concentration in the first layer film.

The above film formation was performed on five substrates in a row, and the following items were evaluated.

Increasing Amount of Defects:

Increasing amount of defects before and after the film formation were evaluated. Increasing amount of defects having a size of 0.2 µm or more was 3.

Chemical Resistance:

The change of the transmittance before and after each film was immersed in an prepared solution (23° C.) of ammonia water:hydrogen peroxide solution:water=1:1:10 for one hour was measured. If the film has good chemical resistance, it seems that the change of the transmittance before and after immersion in the chemical solution is small. In addition, the wavelength for the measurement was 193 nm. The rate of change of the transmittance before and after immersion in the chemical solution was 0.081.

Comparative Example 3

As shown in FIG. 19, a direct current sputtering apparatus 120 in which two targets were disposed was used for forming the multilayer phase shift film. A $MoSi_2$ target was used as a target 122a for an optical characteristic film and a Si target was used as the other target 122b.

First, the first layer film having a thickness of 500 Å was formed on the quartz substrate by sputtering by discharging the $MoSi_2$ target 122a at 1000 W and discharging the Si target 122b at 1000 W while a quartz substrate was rotated at 30 rpm. In that case, a mixed gas of Ar=20 $cm^3$/min, $N_2$=100 $cm^3$/min, and $O_2$=5 $cm^3$/min was introduced as a sputtering gas. The gas pressure in the sputtering was adjusted at 0.2 Pa.

Subsequently, as in the formation of the first layer film, the $MoSi_2$ target 122a was discharged at 1000 W and the Si target 122b was also discharged at 1000 W without a shutdown of the sputtering discharge, and the second layer film having a thickness of 100 Å was formed. In that case, the other film formation conditions were the same as in the formation of the first layer film.

In addition, the Mo contents in the first layer film and the second layer film were calculated from the discharge powers in the sputtering. The ratio of the Mo contents was calculated from the following formula. As a result, the ratio was 1.000.

The ratio of the Mo contents=Mo concentration in the second layer film/Mo concentration in the first layer film.

The above film formation was performed on five substrates in a row, and the following items were evaluated.

Increasing Amount of Defects:

Increasing amount of defects before and after the film formation were evaluated. Increasing amount of defects having a size of 0.2 μm or more was 3.

Chemical Resistance:

The change of the transmittance before and after each film was immersed in an prepared solution (23° C.) of ammonia water:hydrogen peroxide solution:water=1:1:10 for one hour was measured. If the film has good chemical resistance, it seems that the change of the transmittance before and after immersion in the chemical solution is small. In addition, the wavelength for the measurement of 193 nm was used. The rate of change of the transmittance before and after immersion in the chemical solution was 0.115.

Comparative Example 4

As shown in FIG. 19, a direct current sputtering apparatus 120 in which two targets were disposed was used for forming the multilayer phase shift film. A $MoSi_2$ target was used as a target 122a for an optical characteristic film and a Si target was used as the other target 122b.

First, the first layer film having a thickness of 500 Å was formed on the quartz substrate by sputtering by discharging the $MoSi_2$ target 122a at 1000 W and discharging the Si target 122b at 1000 W while a quartz substrate was rotated at 30 rpm. In that case, a mixed gas of Ar=20 $cm^3$/min, $N_2$=100 $cm^3$/min, and $O_2$=5 $cm^3$/min was introduced as a sputtering gas. The gas pressure in the sputtering was adjusted at 0.2 Pa.

Subsequently, the discharge powers to the $MoSi_2$ target 122a and the Si target 122b were changed into 10 W and 1000 W, respectively without a shutdown of the sputtering discharge, and the second layer film having a thickness of 100 Å was formed. In that case, the other film formation conditions were the same as in the formation of the first layer film.

In addition, the Mo contents in the first layer film and the second layer film were calculated from the discharge powers in the sputtering the ratio of the Mo contents was calculated from the following formula. As a result, the ratio was 0.02.

The ratio of the Mo contents=Mo concentration in the second layer film/Mo concentration in the first layer film.

The above film formation was performed on five substrates in a row, and the following items were evaluated.

Increasing Amount of Defects:

Increasing amount of defects before and after the film formation were evaluated. Increasing amount of defects having a size of 0.2 μm or more was 32.

Chemical Resistance:

The change of the transmittance before and after each film was immersed in an prepared solution (23° C.) of ammonia water:hydrogen peroxide solution:water=1:1:10 for one hour was measured. If the film has good chemical resistance, it seems that the change of the transmittance before and after immersion in the chemical solution is small. In addition, the wavelength for the measurement was 193 nm. The rate of change of the transmittance before and after immersion in the chemical solution was 0.011.

Example 7

As shown in FIG. 19, a direct current sputtering apparatus 120 in which two targets were disposed was used for forming the multilayer phase shift film. A $MoSi_4$ target was used as a target 122a for an optical characteristic film and a $MoSi_{40}$ target was used as the other target 122b.

First, the first layer film having a thickness of 500 Å was formed on the quartz substrate by sputtering by discharging the $MoSi_4$ target 122a at 1000 W and discharging the $MoSi_{40}$ target 122b at 50 W while a quartz substrate was rotated at 30 rpm. In that case, a mixed gas of Ar=20 $cm^3$/min, $N_2$=100 $cm^3$/min, and $O_2$=5 $cm^3$/min used as a sputtering gas was introduced. The gas pressure in the sputtering was adjusted at 0.2 Pa.

Subsequently, the discharge powers to the $MoSi_4$ target 122a and the $MoSi_{40}$ target 122b were changed into 50 W and 1000 W, respectively without a shutdown of the sputtering discharge, and the second layer film having a thickness of 100 Å was formed. In that case, the other film formation conditions were the same as in the formation of the first layer film.

In addition, the Mo contents in the first layer film and the second layer film were calculated from the discharge powers in the sputtering. The ratio of the Mo contents was calculated from the following formula. As a result, the ratio was 0.171.

The ratio of the Mo contents=Mo concentration in the second layer film/Mo concentration in the first layer film.

The above film formation was performed on five substrates in a row, and the following items were evaluated.

Increasing Amount of Defects:

Increasing amount of defects before and after the film formation were evaluated. Increasing amount of defects having a size of 0.2 μm or more was 5.

Chemical Resistance:

The change of the transmittance before and after each film was immersed in a prepared solution (23° C.) of ammonia water:hydrogen peroxide solution:water=1:1:10 for one hour was measured. If the film has good chemical resistance, it seems that the change of the transmittance before and after immersion in the chemical solution is small. In addition, the wavelength for the measurement was 193 nm. The rate of change of the transmittance before and after immersion in the chemical solution was 0.024.

Comparative Example 5

As shown in FIG. 19, a direct current sputtering apparatus 120 in which two targets were disposed was used for forming the multilayer phase shift film. A $MoSi_4$ target was used as a target 122a for an optical characteristic film, but the other target 122b was not used.

First, the first layer film having a thickness of 500 Å was formed on the quartz substrate by sputtering by discharging the $MoSi_4$ target 122a at 1000 W while a quartz substrate was rotated at 30 rpm. In that case, a mixed gas of Ar=20 $cm^3$/min, $N_2$=100 $cm^3$/min, and $O_2$=5 $cm^3$/min was introduced as a sputtering gas. The gas pressure in the sputtering was adjusted at 0.2 Pa.

Subsequently, after the discharge to the $MoSi_4$ target 122a was once finished, the $MoSi_4$ target 122a was discharged again at 1000 W, and the second layer film having a thickness of 100 Å was formed. In that case, the other film formation conditions were the same as in the formation of the first layer film.

In addition, the Mo contents in the first layer film and the second layer film were calculated from the discharge power in the sputtering. The ratio of the Mo contents was calculated from the following formula. As a result, the ratio was 1.000.

The ratio of the Mo contents=Mo concentration in the second layer film/Mo concentration in the first layer film.

The above film formation was performed on five substrates in a row, and the following items were evaluated.

Increasing Amount of Defects:

Increasing amount of defects before and after the film formation were evaluated. Increasing amount of defects having a size of 0.2 μm or more was 143.

Chemical Resistance:

The change of the transmittance before and after each film was immersed in an prepared solution (23° C.) of ammonia water:hydrogen peroxide solution:water=1:1:10 for one hour was measured. If the film has good chemical resistance, it seems that the change of the transmittance before and after immersion in the chemical solution is small. In addition, the wavelength for the measurement was 193 nm. The rate of change of the transmittance before and after immersion in the chemical solution was 0.120.

The above results are summarized in Tables 7 and 8.

As clear from these results, it can be confirmed that when the phase shift mask blank comprises at least a multilayer phase shift film composed of two or more layers of phase shift films formed on a substrate, the multilayer phase shift film comprises a metal silicide compound (an oxide film, a nitride film, or an oxide nitride film of a metal silicide), and a metal content in an outermost layer of the phase shift film in the multilayer phase shift film is 1/20-1/3 (molar ratio) of a metal content of a phase shift film which contains the most metal among phase shift films in the multilayer phase shift film, and thereby, a phase shift mask blank and a phase shift mask having good chemical resistance and having few defects can be obtained.

TABLE 7

| | First Layer | | | Second Layer | | | | Particles | Chemical |
|---|---|---|---|---|---|---|---|---|---|
| | Discharge Power (W) | | Film Thickness | Discharge Power (W) | | Film Thickness | Ratio of Mo Content Second layer/ | of 0.2 μm or more in Film | Resistance (Rate of Change of |
| No | $MoSi_2$ | Si | Å | $MoSi_2$ | Si | Å | First layer | formation | Transmittance) |
| Example 3 | 1000 | 1000 | 500 | 26 | 1000 | 100 | 0.051 | 5 | 0.012 |
| Example 4 | 1000 | 1000 | 500 | 50 | 1000 | 100 | 0.095 | 2 | 0.018 |
| Example 5 | 1000 | 1000 | 500 | 100 | 1000 | 100 | 0.182 | 4 | 0.022 |
| Example 6 | 1000 | 1000 | 500 | 200 | 1000 | 100 | 0.333 | 5 | 0.025 |
| Comparative Example 2 | 1000 | 1000 | 500 | 400 | 1000 | 100 | 0.571 | 3 | 0.081 |
| Comparative Example 3 | 1000 | 1000 | 500 | 1000 | 1000 | 100 | 1.000 | 3 | 0.115 |
| Comparative Example 4 | 1000 | 1000 | 500 | 10 | 1000 | 100 | 0.020 | 32 | 0.011 |

Five films are formed in the same conditions and these average value is shown.

TABLE 8

| No | First Layer Discharge Power (W) MoSi$_4$ | First Layer Discharge Power (W) MoSi$_{40}$ | First Layer Film Thickness Å | Second Layer Discharge Power (W) MoSi$_4$ | Second Layer Discharge Power (W) MoSi$_{40}$ | Second Layer Film Thickness Å | Ratio of Mo Content Second Layer/ First layer | Particles of 0.2 μm or more in Film formation | Chemical Resistance (Rate of Change of Transmittance) |
|---|---|---|---|---|---|---|---|---|---|
| Example 7 | 1000 | 50 | 500 | 50 | 1000 | 100 | 0.171 | 5 | 0.024 |
| Comparative Example 5 | 1000 | 0 Not discharged | 500 | 1000 | 0 Not discharged | 100 | 1.000 | 143 | 0.120 |

Five films are formed in the same conditions and these average value is shown.

Example 8

Two layers of phase shift films were formed on a quartz substrate with a reactive sputtering apparatus. First, plural targets and the quartz substrate were disposed in the same film forming chamber. In the chamber, the plural targets and the quartz substrate were opposed to each other. In this Example, two MoSi targets of a MoSi target 1 and a MoSi target 2 having different compositions from each other and two silicon targets of a Si target 1 and a Si target 2 were disposed.

First, a phase shift film comprising MoSiON of a film composition 1 was formed with the MoSi target 1 and the Si target 1. As to the sputtering gas, N$_2$O was used as a reactive gas, and Ar was used as an inert gas. As described above, after the phase shift film having the film composition 1 was deposited in 300 Å, a phase shift film comprising MoSiON of a film composition 2 was formed with the MoSi target 2 and the Si target 2.

Figure 22:
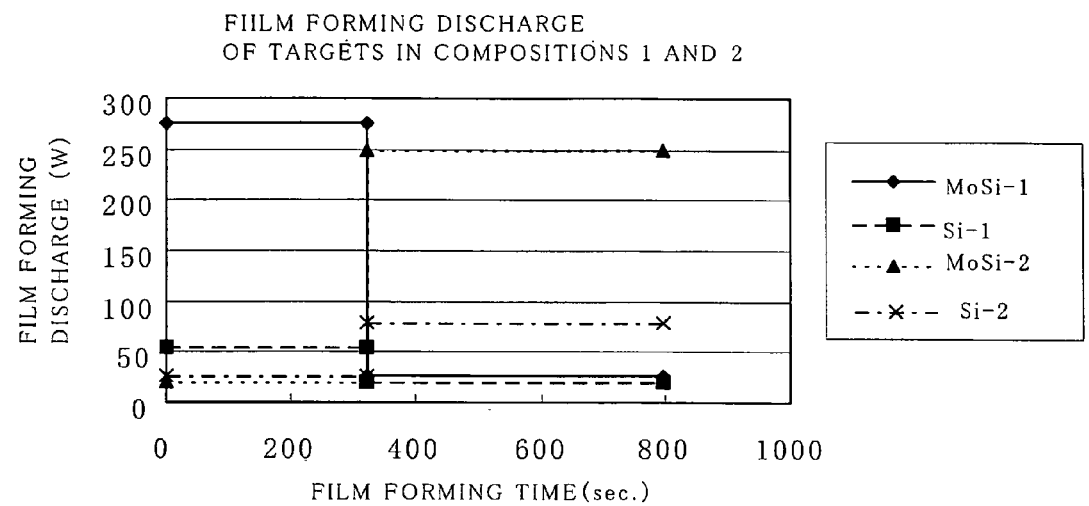
FIG. 22 is a graph showing change of a film formation output of targets used in Example 8.

In addition, in the Examples, each target was not shut down as shown in FIG. 22. While the phase shift film having the film composition 1 was formed, the targets for the phase shift film having the film composition 2 were discharged at a minimum power possible to stably discharge the targets. Similarly, when the phase shift film having the film composition 2 was formed, the targets for the phase shift film having the film composition 1 were discharged at a minimum power possible to stably discharge the targets. Two phase shift mask blank for samples were produced in above process.

The total number of particles having a size of 0.2 μm or more in the phase shift films of each of two phase shift mask blanks was inspected. Particles were measured with a defect inspection machine GM-1000 made by Hitachi Electronics Engineering Co., Ltd. In addition, in order to accurately inspect particles generated due to the film formation, after the phase shift film was formed, particles were inspected before cleaning and then inspected after cleaning. And only the same particles existing before and after the cleaning were counted. The results were shown in Table 9.

TABLE 9

| | Defect Size (μm) | | | Total |
|---|---|---|---|---|
| | 0.2-0.5 | 0.5-1.0 | 1.0-2.0 | 2 or more | Number of Defects |
| Sample 1 | 0 | 1 | 1 | 0 | 2 |
| Sample 2 | 1 | 1 | 0 | 0 | 2 |

As described above, it is found that in the phase shift films formed by the method of the present invention, all of the phase shift mask blanks for samples has only 2 particles having a size of 0.2 μm or more. This is because each target was continuously discharged without a shutdown, and thereby, the discharge was stable.

In the Example, since the targets, which were not mainly used for forming each layer of the phase shift films, were also discharged continuously, it was recognized that each layer of the phase shift films contained 1-10% of film compositions of adjacent layers. However, even if the phase shift film contains the above degree of the film composition of the adjacent layers, there is almost no adverse influence on optical characteristics, etc. of each layer of the films.

Comparative Examination 6

As in Example 8, the same targets were disposed in the same reactive sputtering apparatus, and two layers of phase shift films were formed on a quartz substrate. As in Example 8, a phase shift film comprising MoSiON of a film composition 1 was formed with the MoSi target 1 and the Si target 1. After the film composition 1 was deposited in 300 Å, a phase shift film comprising MoSiON of a film composition 2 was formed with the MoSi target 2 and the Si target 2.

Figure 23:
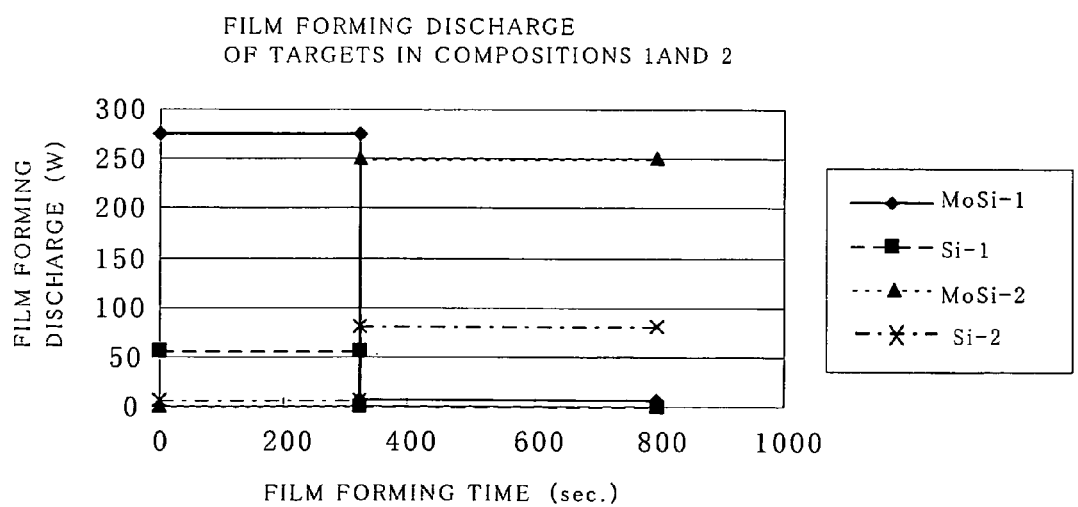
FIG. 23 is a graph showing change of a film formation output of targets used in Comparative Example 6.

In the Comparative Example, as shown in FIG. 23, when the phase shift film having the film composition 1 was formed, only the MoSi target 1 and the Si target 1 were discharged, but the discharge to the MoSi target 2 and the Si target 2 was completely stopped. Subsequently, when the phase shift film having the film composition 2 was formed, only the MoSi target 2 and the Si target 2 were discharged, but the discharge to the MoSi target 1 and the Si target 1 was completely stopped. As described above, two phase shift mask blanks for samples were produced.

The total number of particles having a size of 0.2 μm or more in the phase shift films of each of two phase shift mask blanks produced as described above was inspected as in Example 8. The results were shown in Table 10. From Table 10, it is found that in the phase shift films formed in the Comparative Example, all of the samples has many particles having a size of 0.2 μm or more. This is because the discharge becomes instable when starting and finishing the discharge to the targets, and thereby, scattering of particles or the like may occur.

TABLE 10

| | Defect Size (μm) | | | | Total |
|---|---|---|---|---|---|
| | 0.2-0.5 | 0.5-1.0 | 1.0-2.0 | 2 or more | Number of Defects |
| Sample 3 | 1 | 3 | 0 | 6 | 10 |
| Sample 4 | 2 | 4 | 0 | 4 | 10 |

The present invention is not limited to the above-described embodiments. The above-described embodiments are mere examples, and those having substantially the same structure as that described in the appended claims and providing the similar action and effects are included in the scope of the present invention.

For example, in the above first embodiment, the case that a single layer phase shift film is formed on a quartz substrate is mainly explained. However, the present invention is not limited thereto, and the productions of a multilayer type phase shift mask blank and phase shift mask having two or more layers of phase shift films can be applied to the present invention.

And, in the above third embodiment, the case that two layers of phase shift films are formed on a quartz substrate. However, the present invention is not limited thereto, and the productions of a multilayer type phase shift mask blank and phase shift mask having three or more layers of phase shift films can be applied to the present invention.

What is claimed is:

1. A method of producing a phase shift mask blank wherein the method includes at least a step of forming two or more phase shift films having different compositions respectively on a substrate, and in the step, each of the phase shift films having different compositions respectively is formed by the sputtering method by simultaneously discharging at least one or more silicon target and one or more target selected from the group consisting of a metal silicide, a metal silicide oxide, a metal silicide nitride, a metal silicide oxide nitride, a metal silicide oxide carbide, a metal silicide nitride carbide, and a metal silicide oxide nitride carbide;

further, each phase shift film is formed by continuously discharging targets used for forming any one of the layers of the phase shift films without shutdown even when the other layers of the phase shift films are formed, and a composition ratio of metal and silicon in the phase shift film is changed by adjusting discharge powers applied to each target.

2. The method of producing a phase shift mask blank according to claim 1 wherein a metal component of the target is molybdenum.

3. The method of producing a phase shift mask blank according to claim 1 wherein when the phase shift film is formed by the sputtering method, a gas containing oxygen, nitrogen, or carbon as a constituent element is used as a sputtering gas.

4. The method of producing a phase shift mask blank according to claim 2 wherein when the phase shift film is formed by the sputtering method, a gas containing one or more elements selected from oxygen, nitrogen and carbon as constituent elements is used as a sputtering gas.

5. A method of producing a phase shift mask wherein a pattern is formed on the phase shift film of the phase shift mask blank produced by the production method according to any one of claims 1, 2, 3 and 4.

6. A phase shift mask blank wherein at least two or more phase shift films having different compositions respectively are formed on a substrate, each of the phase shift mask films having different compositions respectively contains at least metal and silicon as constituent elements, and each phase shift film is formed by a sputtering method by simultaneously discharging at least one or more silicon target and one or more target selected from the group consisting of a metal suicide, a metal silicide oxide, a metal silicide nitride, a metal suicide oxide nitride, a metal silicide oxide carbide, a metal suicide nitride carbide, and a metal silicide oxide nitride carbide;

further, each phase shift film is formed by continuously discharging targets used for forming any one of the layers of the phase shift films without shutdown even when the other layers of the phase shift films are formed, and a composition ratio of metal and silicon in the phase shift film is changed by adjusting discharge powers applied to each target.

7. The phase shift mask blank according to claim 6 wherein the phase shift film comprises a metal silicide, a metal silicide oxide, a metal silicide nitride, a metal silicide oxide nitride, a metal silicide oxide carbide, a metal silicide nitride carbide, or a metal silicide oxide nitride carbide.

8. The phase shift mask blank according to claim 6 wherein a metal component of the phase shift film is molybdenum.

9. The phase shift mask blank according to claim 7 wherein a metal component of the phase shift film is molybdenum.

10. The phase shift mask blank according to claim 6 wherein a center value of a distribution of phase differences in the phase shift film to wavelength of light used in exposure is 180±10 degrees, and a center value of a distribution of transmittances in the phase shift film is 3-40%.

11. The phase shift mask blank according to claim 7 wherein a center value of a distribution of phase differences in the phase shift film to wavelength of light used in exposure is 180±10 degrees, and a center value of a distribution of transmittances in the phase shift film is 3-40%.

12. The phase shift mask blank according to claim 8 wherein a center value of a distribution of phase differences in the phase shift film to wavelength of light used in exposure is 180±10 degrees, and a center value of a distribution of transmittances in the phase shift film is 3-40%.

13. The phase shift mask blank according to claim 9 wherein a center value of a distribution of phase differences in the phase shift film to wavelength of light used in exposure is 180±10 degrees, and a center value of a distribution of transmittances in the phase shift film is 3-40%.

14. The phase shift mask blank according to claim 6 wherein a distribution of phase differences in the phase shift film to wavelength of light used in exposure is within ±1.5°, and a distribution of transmittances in the phase shift film is within ±0.15%.

15. The phase shift mask blank according to claim 7 wherein a distribution of phase differences in the phase shift film to wavelength of light used in exposure is within ±1.5°, and a distribution of transmittances in the phase shift film is within ±0.15%.

16. The phase shift mask blank according to claim 8 wherein a distribution of phase differences in the phase shift film to wavelength of light used in exposure is within ±1.5°, and a distribution of transmittances in the phase shift film is within ±0.15%.

17. The phase shift mask blank according to claim 9 wherein a distribution of phase differences in the phase shift film to wavelength of light used in exposure is within ±1.5°, and a distribution of transmittances in the phase shift film is within ±0.15%.

18. The phase shift mask blank according to claim 10 wherein a distribution of phase differences in the phase shift film to wavelength of light used in exposure is within ±1.5°, and a distribution of transmittances in the phase shift film is within ±0.15%.

19. The phase shift mask blank according to claim 11 wherein a distribution of phase differences in the phase shift film to wavelength of light used in exposure is within ±1.5°, and a distribution of transmittances in the phase shift film is within ±0.15%.

20. The phase shift mask blank according to claim 12 wherein a distribution of phase differences in the phase shift film to wavelength of light used in exposure is within ±1.5°, and a distribution of transmittances in the phase shift film is within ±0.15%.

21. The phase shift mask blank according to claim 13 wherein a distribution of phase differences in the phase shift film to wavelength of light used in exposure is within ±1.5°, and a distribution of transmittances in the phase shift film is within ±0.15%.

22. A phase shift mask wherein a pattern is formed on the phase shift film of the phase shift mask blank according to any one of claims 6-21.

23. A phase shift mask blank wherein the phase shift mask blank comprises at least a multilayer phase shift film composed of two or more layers of phase shift films on a substrate, the multilayer phase shift film comprises a metal silicide compound, and a metal content in an outermost layer of the phase shift film in the multilayer phase shift film is 1/20-1/3 (molar ratio) of a metal content of a phase shift film which contains the most metal among the phase shift films in the multilayer phase shift film.

24. The phase shift mask blank according to claim 23 wherein the metal silicide compound comprises a metal silicide and a compound of oxygen and/or nitrogen.

25. The phase shift mask blank according to claim 23 wherein the metal silicide compound comprises a compound of a molybdenum silicide.

26. The phase shift mask blank according to claim 24 wherein the metal silicide compound comprises a compound of a molybdenum silicide.

27. The phase shift mask blank according to claim 23 wherein a Cr base light shielding film and/or a Cr base antireflection film is formed on the multilayer phase shift film.

28. The phase shift mask blank according to claim 24 wherein a Cr base light shielding film and/or a Cr base antireflection film is formed on the multilayer phase shift film.

29. The phase shift mask blank according to claim 25 wherein a Cr base light shielding film and/or a Cr base antireflection film is formed on the multilayer phase shift film.

30. The phase shift mask blank according to claim 26 wherein a Cr base light shielding film and/or a Cr base antireflection film is formed on the multilayer phase shift film.

31. A phase shift mask wherein a pattern is formed on the multilayer phase shift film of the phase shift mask blank according to claims 23-30.

* * * * *